United States Patent
Chu et al.

(10) Patent No.: US 12,211,820 B2
(45) Date of Patent: Jan. 28, 2025

(54) WAFER BONDING APPARATUS AND METHOD

(71) Applicant: Taiwan Semiconductor Manufacturing Co., Ltd., Hsinchu (TW)

(72) Inventors: Cheng-I Chu, Taipei (TW); Han-De Chen, Hsinchu (TW); Chen-Fong Tsai, Hsinchu (TW); Jyh-Cherng Sheu, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 349 days.

(21) Appl. No.: 17/472,086

(22) Filed: Sep. 10, 2021

(65) Prior Publication Data

US 2023/0010038 A1    Jan. 12, 2023

Related U.S. Application Data

(60) Provisional application No. 63/219,910, filed on Jul. 9, 2021.

(51) Int. Cl.
| | |
|---|---|
| *H01L 23/00* | (2006.01) |
| *H01J 37/32* | (2006.01) |
| *H01L 21/02* | (2006.01) |
| *H01L 21/26* | (2006.01) |

(52) U.S. Cl.
CPC ........ *H01L 24/83* (2013.01); *H01J 37/32422* (2013.01); *H01J 37/32715* (2013.01); *H01L 21/02057* (2013.01); *H01L 21/26* (2013.01); *H01L 2224/83896* (2013.01)

(58) Field of Classification Search
CPC ......... H01L 21/02252; H01L 21/02315; H01L 21/0234; H01L 21/76855
See application file for complete search history.

(56) References Cited

U.S. PATENT DOCUMENTS

2020/0043884 A1*    2/2020   Lee ......................... H01L 24/80

OTHER PUBLICATIONS

Madou, Marc. Fundamentals of Microfabrication. CRC Press, 1997 (Year: 1997).*
Bengtsson, S., et al., "The influence of wafer dimensions on the contact wave velocity in silicon wafer bonding," Applied Physics Letter 69, Nov. 25, 1996, 4 pages.
(Continued)

*Primary Examiner* — Evren Seven
*Assistant Examiner* — Cole Leon Lindsey
(74) *Attorney, Agent, or Firm* — Slater Matsil, LLP

(57) ABSTRACT

Wafer bonding apparatus and method are provided. A method includes performing a first plasma activation process on a first surface of a first wafer. The first plasma activation process forms a first high-activation region and a first low-activation region on the first surface of the first wafer. A first cleaning process is performed on the first surface of the first wafer. The first cleaning process forms a first plurality of silanol groups in the first high-activation region and the first low-activation region. The first high-activation region includes more silanol groups than the first low-activation region. The first wafer is bonded to a second wafer.

20 Claims, 24 Drawing Sheets

(56) References Cited

OTHER PUBLICATIONS

Gösele, U., et al., "What determines the lateral bonding speed in silicon wafer bonding?," Applied Physics Letter 67, Aug. 7, 1995, 4 pages.
Ma, X., et al., "Void-free low-temperature silicon direct-bonding technique using plasma activation," Journal of Vacuum Science & Technology B: Microelectronics and Nanometer Structures Processing, Measurement, and Phenomena, Jan. 26, 2007, 7 pages, vol. 25, Issue 1, American Institute of Physics, © 2007 American Vacuum Society.
Rieutord, F., et al., "Dynamics of a Bonding Front," Physical Review Letters, Jun. 13, 2005, 4 pages, vol. 94, Issue 23, © 2005 The American Physical Society.
Stengl, R., et al. "A Model for the Silicon Wafer Bonding Process," Japanese Journal of Applied Physics, Oct. 1989, 8 pages, vol. 28, No. 10.
Wortman, J., et al., "Young's Modulus, Shear Modulus, and Poisson's Ratio in Silicon and Germanium," Journal of Applied Physics, Jan. 1965, 5 pages, vol. 36, No. 1, © 1965 The American Institute of Physics.

\* cited by examiner

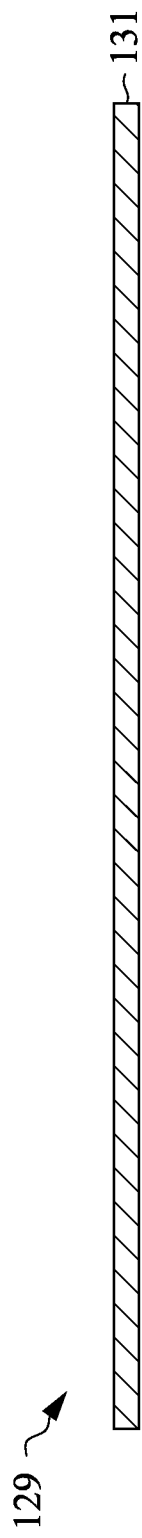

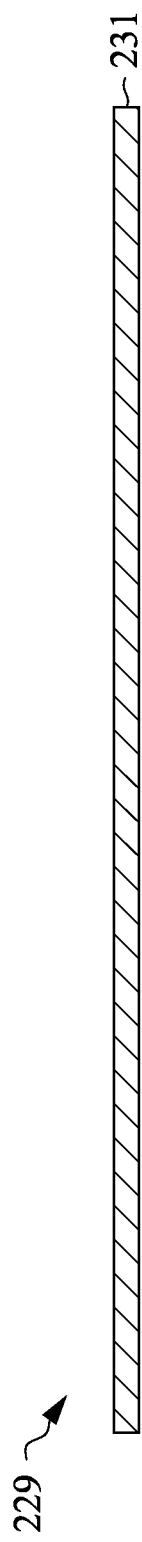

WAFER BONDING APPARATUS AND METHOD

PRIORITY CLAIM AND CROSS-REFERENCE

This application claims the benefit of U.S. Provisional Application No. 63/219,910, filed on Jul. 9, 2021, which application is hereby incorporated herein by reference.

BACKGROUND

Semiconductor manufacturers face a constant challenge to comply with Moore's Law. They constantly strive to continually decrease feature sizes, such as sizes of active and passive devices, interconnecting wire widths and thicknesses, and power consumption as well as increase device density, wire density and operating frequencies. These smaller electronic components also require smaller packages that utilize less area than packages of the past, in some applications.

Three dimensional integrated circuits (3DICs) are a recent development in semiconductor packaging in which multiple semiconductor dies are stacked upon one another, such as package-on-package (PoP) and system-in-package (SiP) packaging techniques. Some methods of forming 3DICs involve bonding together two or more semiconductor wafers, and active circuits such as logic, memory, processor circuits and the like located on different semiconductor wafers. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. Once two semiconductor wafers are bonded together, the interface between two semiconductor wafers may provide an electrically conductive path between the stacked semiconductor wafers.

One advantageous feature of stacked semiconductor devices is that much higher density can be achieved by employing stacked semiconductor devices. Furthermore, stacked semiconductor devices can achieve smaller form factors, cost-effectiveness, increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a cross-sectional view illustrating a bonding layer in accordance with some embodiments.

FIG. 3 is a cross-sectional view illustrating a bonding layer in accordance with some embodiments.

FIG. 5 is a cross-sectional view illustrating a bonding layer in accordance with some embodiments.

FIG. 6 is a cross-sectional view illustrating a bonding layer in accordance with some embodiments.

DETAILED DESCRIPTION

Figure 1A:
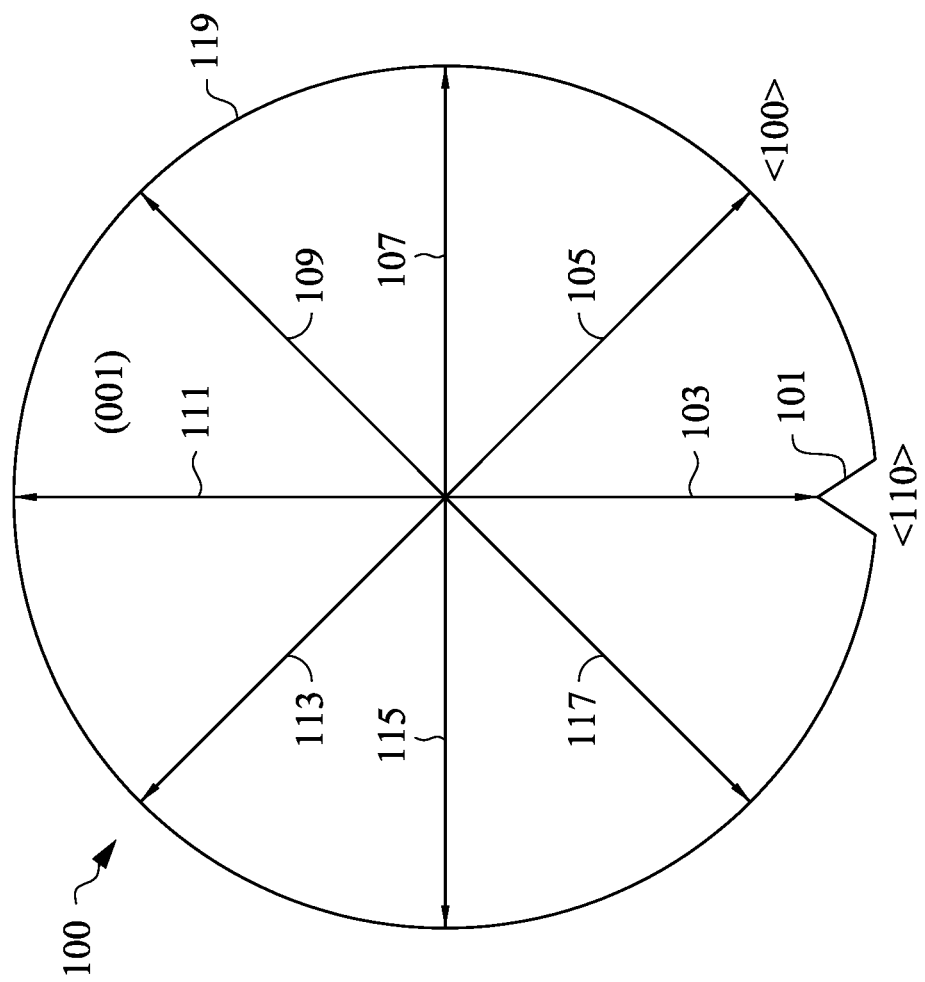
FIGS. 1A and 1B are top and cross-sectional views illustrating a wafer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are discussed below in a specific context, namely a wafer bonding apparatus and method. Various embodiments may be applied to a fusion bonding, an oxide-to-oxide bonding, a hybrid bonding, hydrophilic bonding, hydrophobic bonding, or the like. Some specific examples are provided in which device and/or carrier wafers are bonded and which can be applied to image sensor (IS), through substrate via (TSV), three dimensional integrated circuit (3DIC) and backside power network (BPN) applications. However, aspects of this disclosure may be applied in numerous other contexts, such as to wafer bonding to achieve a semiconductor-on-insulator (SOI) wafer, a strained semiconductor virtual substrate, or the like. Further, some modifications to processes and systems are discussed below, and one of ordinary skill in the art will readily understand additional modifications that can be applied. Embodiments contemplate these modifications. Further, although some methods are described in a particular order, some embodiments contemplate methods performed in any logical order.

Various embodiments describe a plasma grid assembly design in a remote plasma system to modulate plasma intensity during a plasma activation process performed on a wafer before a wafer bonding process. The plasma grid assembly allows for modulating plasma intensity or flux along different in-plain crystal directions of a wafer. Various embodiments allow for minimizing distortion caused by anisotropy of a wafer along different in-plane crystal directions, reducing or avoiding bubble defects and improving bond strength uniformity.

Figure 1B:
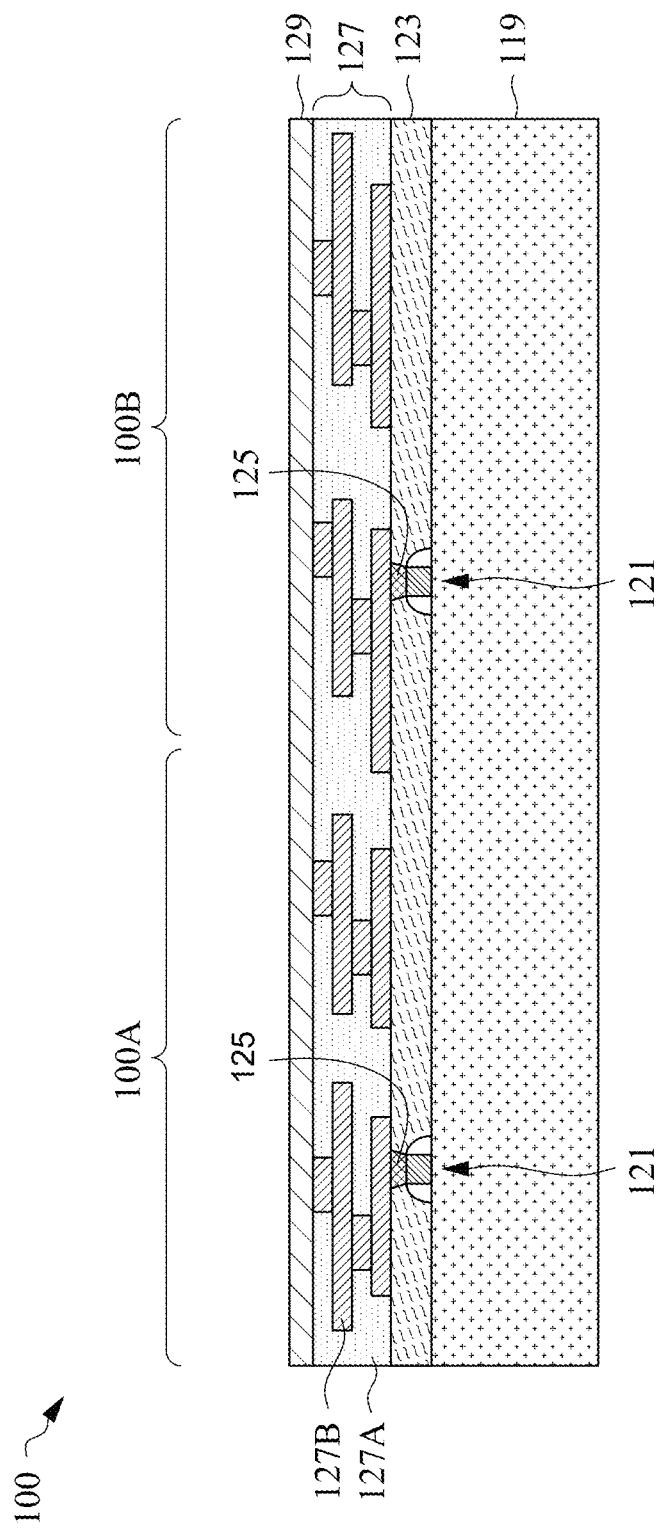

FIGS. 1A and 1B are top and cross-sectional views illustrating a wafer 100 in accordance with some embodiments. In particular, FIG. 1B illustrates a cross-sectional view of a portion of the wafer 100. In some embodiments, the wafer 100 comprises a plurality of die regions (such as die regions 100A and 100B), which may be singulated to form individual dies. These dies may be any suitable type of dies, such as, for example, an application-specific integrated circuit (ASIC) device, an image sensor, a logic die, a memory device, or the like. However, any other suitable type of devices, such as system on a chip (SoC) type of devices, may alternatively be utilized. In other embodiments, the wafer 100 may be a bare semiconductor material layer (such as, for example, a bare silicon layer) or a bare dielectric layer (such as, for example, a bare oxide layer) and may be free of additional structures formed thereon. In some embodiments, a wafer formed of a bare dielectric layer may be used in BPN applications.

In some embodiments, the wafer 100 comprises a substrate 119, such as silicon, doped or undoped, or an active layer of a semiconductor-on-insulator (SOI) substrate. The substrate 119 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 119 has an active surface (e.g., the surface facing upwards in FIG. 1B), sometimes called a front side, and an inactive surface (e.g., the surface facing downwards in FIG. 1B), sometimes called a backside.

In some embodiments when the substrate 119 is made of silicon, a major surface of the substrate 119 may comprise a (001) crystallographic plane. In some embodiments, the edge of the substrate 119 has a notch 101 in an in-plane direction 103 extending from a center of the substrate 119 to the edge of the substrate 119. In some embodiments when the major surface of the substrate 119 comprises the (001) crystallographic plane, the in-plane direction 103 is along a <110> crystallographic direction. The substrate 119 further comprises in-plane directions 107, 111, and 115 along <110> crystallographic directions. The in-plane direction 107 is rotated counterclockwise with respect to the in-plane direction 103 by 90 degrees. The in-plane direction 111 is rotated counterclockwise with respect to the in-plane direction 103 by 180 degrees. The in-plane direction 115 is rotated counterclockwise with respect to the in-plane direction 103 by 270 degrees. The substrate 119 further comprises in-plane directions 105, 109, 113, and 117 along <100> crystallographic directions. The in-plane direction 105 is rotated counterclockwise with respect to the in-plane direction 103 by 45 degrees. The in-plane direction 109 is rotated counterclockwise with respect to the in-plane direction 103 by 135 degrees. The in-plane direction 113 is rotated counterclockwise with respect to the in-plane direction 103 by 225 degrees. The in-plane direction 117 is rotated counterclockwise with respect to the in-plane direction 103 by 315 degrees.

As described below in greater detail, the wafer 100 is bonded to another wafer (such, for example, a wafer 200 illustrated in FIGS. 4A and 4B). Because the mechanical properties (such as Young's modulus and Poisson's ratio) of the substrate 119 differ along <100> and <110> crystallographic directions, a bond wave propagation speed, a bond strength and a post bonding deformation also differ along <100> and <110> crystallographic directions. In some embodiments, the bond wave propagation speed along <100> crystallographic direction is greater than the bond wave propagation speed along <110> crystallographic direction. In some embodiments, the bond strength along <100> crystallographic direction is greater than the bond strength along <110> crystallographic direction. These differences between the bond wave propagation speed and the bond strength may cause wafer distortion after performing a wafer bonding process. As described below for greater detail, a modulated plasma activation process is performed on bonding surfaces of one or both of the wafers to activate bonding surfaces of the wafers and to minimize distortion caused by anisotropy of mechanical properties of the substrate 119, reduce or avoid bubble defects and improve bond strength uniformity. In some embodiments, the bond wave propagation speed, the bond strength and the post bonding deformation may be also affected by various device and structures formed over the substrate 119. In such embodiments, a modulated plasma activation process may be also used to minimize effects due to various device and structures formed over the substrate 119.

In some embodiments, devices (represented by transistors) 121 may be formed at the front surface of the substrate 119. The devices 121 may be active devices (e.g., transistors, diodes, photosensitive devices, etc.), capacitors, resistors, inductors, the like, or combinations thereof. An inter-layer dielectric (ILD) 123 is over the front surface of the substrate 119. The ILD 123 surrounds and may cover the devices 121. The ILD 123 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like, and may be formed using spin coating, lamination, atomic layer deposition (ALD), chemical vapor deposition (CVD), or the like.

Conductive plugs 125 extend through the ILD 123 to electrically and physically couple to the devices 121. For example, when the devices 121 are transistors, the conductive plugs 125 may couple the gates and source/drain regions of the transistors. The conductive plugs 125 may be formed of tungsten, cobalt, nickel, copper, silver, gold, aluminum, the like, or combinations thereof.

An interconnect structure 127 is over the ILD 123 and the conductive plugs 125. The interconnect structure 127 interconnects the devices 121 to form an integrated circuit. The interconnect structure 127 may comprise metallization patterns 127B in dielectric layers 127A, such as inter-metal dielectrics (IMDs), on the ILD 123. In some embodiments, the IMDs 127A may be formed using similar materials and methods as ILD 123 and the description is not repeated herein. The metallization patterns 127B include metal lines and vias formed in one or more IMDs 127A. In some embodiments, the interconnect structure 127 may be formed of alternating layers of dielectric (e.g., low-k dielectric material) and conductive (e.g., copper) materials with vias interconnecting the layers of the conductive material and may be formed through any suitable process (such as deposition, damascene, dual damascene, or the like). The metallization patterns 127B of the interconnect structure 127 are electrically coupled to the devices 121 by the conductive plugs 125.

In some embodiments, a bonding layer 129 is formed over the interconnect structure 127. As described below in greater detail, the bonding layer 129 is used to bond the wafer 100 to another wafer (such as, for example, a wafer 200 illustrated in FIGS. 4A and 4B). In some embodiments, the bonding layer 129 is mechanically coupled to a bonding layer of another wafer after the bonding. In other embodiments, the bonding layer 129 is mechanically and electrically coupled to the bonding layer of another wafer after the bonding.

FIG. 2 is a cross-sectional view of the bonding layer 129 in accordance with some embodiments. In some embodiments, the bonding layer 129 comprises an insulating layer 131 formed over the interconnect structure 127 (see FIG. 1B). In some embodiments, the insulating layer 131 may comprise one or more layers of silicon oxide, silicon nitride, silicon oxynitride, the like, or combinations thereof, and may be formed using ALD, CVD, or the like. In some embodiments, a planarization process is performed on the bonding layer 129. The planarization process may comprise chemical mechanical polishing (CMP), grinding, etching, a combination thereof, or the like.

FIG. 3 is a cross-sectional view of the bonding layer 129 in accordance with some embodiments. In some embodiments, the bonding layer 129 comprises pads 133 embedded in the insulating layer 131. The pads 133 may be also referred to as bond pads. The pads 133 may comprise a conductive material such as copper, aluminum, or the like. In some embodiments, the pads 133 and the insulating layer 131 may be formed by forming and patterning a conductive material over the interconnect structure 127 (see FIG. 1B) to form the pads 133, forming an insulating material of the insulating layer 131 over the interconnect structure 127 and the pads 133, and planarizing the insulating material to expose the pads 133. The planarization process may comprise CMP, grinding, etching, a combination thereof, or the like. After the planarization process, top surfaces of the pads 133 and a top surface of the insulating layer 131 are substantially level or co-planar within process variations of the planarization process.

In other embodiments, the pads 133 and the insulating layer 131 may be formed by forming an insulating material of the insulating layer 131 over the interconnect structure 127 (FIG. 1B), patterning the insulating material to form openings for the pads 133, depositing a conductive material of the pads 133 in the openings, and planarizing the conductive material to remove portions of the conductive material overfilling the openings. Portions of the conductive material remaining in the openings form pads 133. The planarization process may comprise CMP, grinding, etching, a combination thereof, or the like. After the planarization process, top surfaces of the pads 133 and a top surface of the insulating layer 131 are substantially level or co-planar within process variations of the planarization process.

Figure 4A:
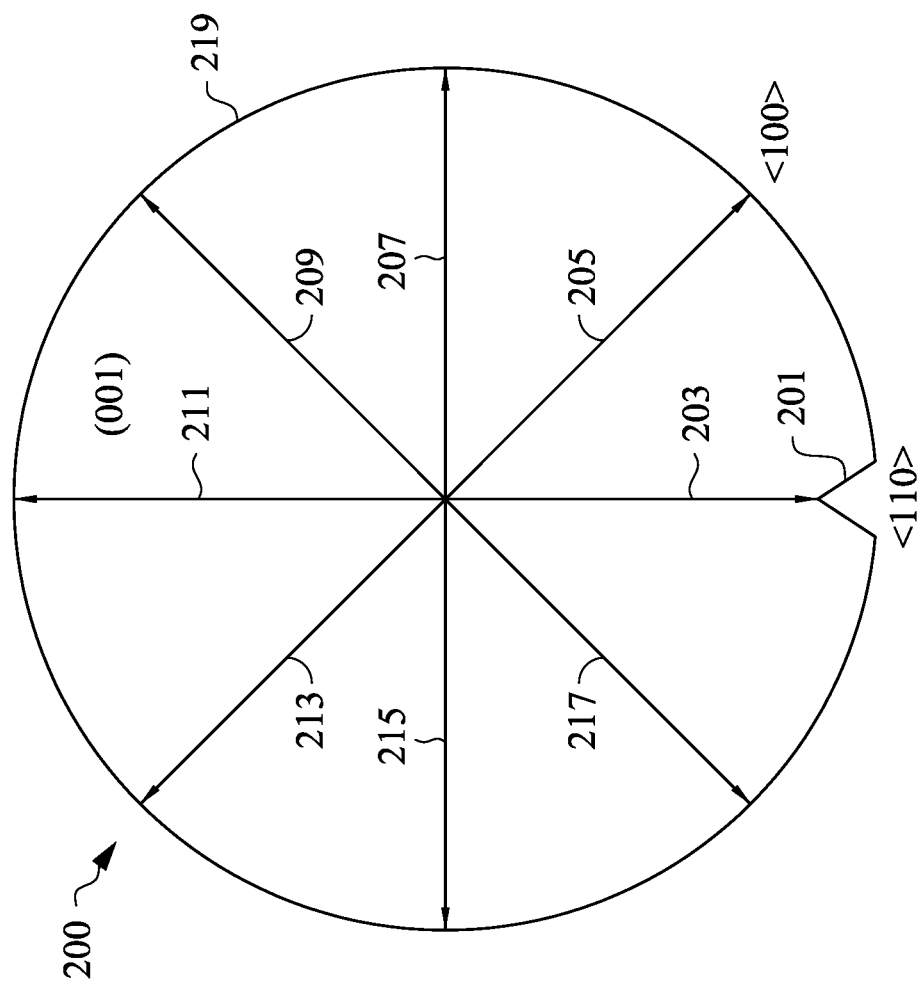
FIGS. 4A and 4B are top and cross-sectional views illustrating a wafer in accordance with some embodiments.
Figure 4B:
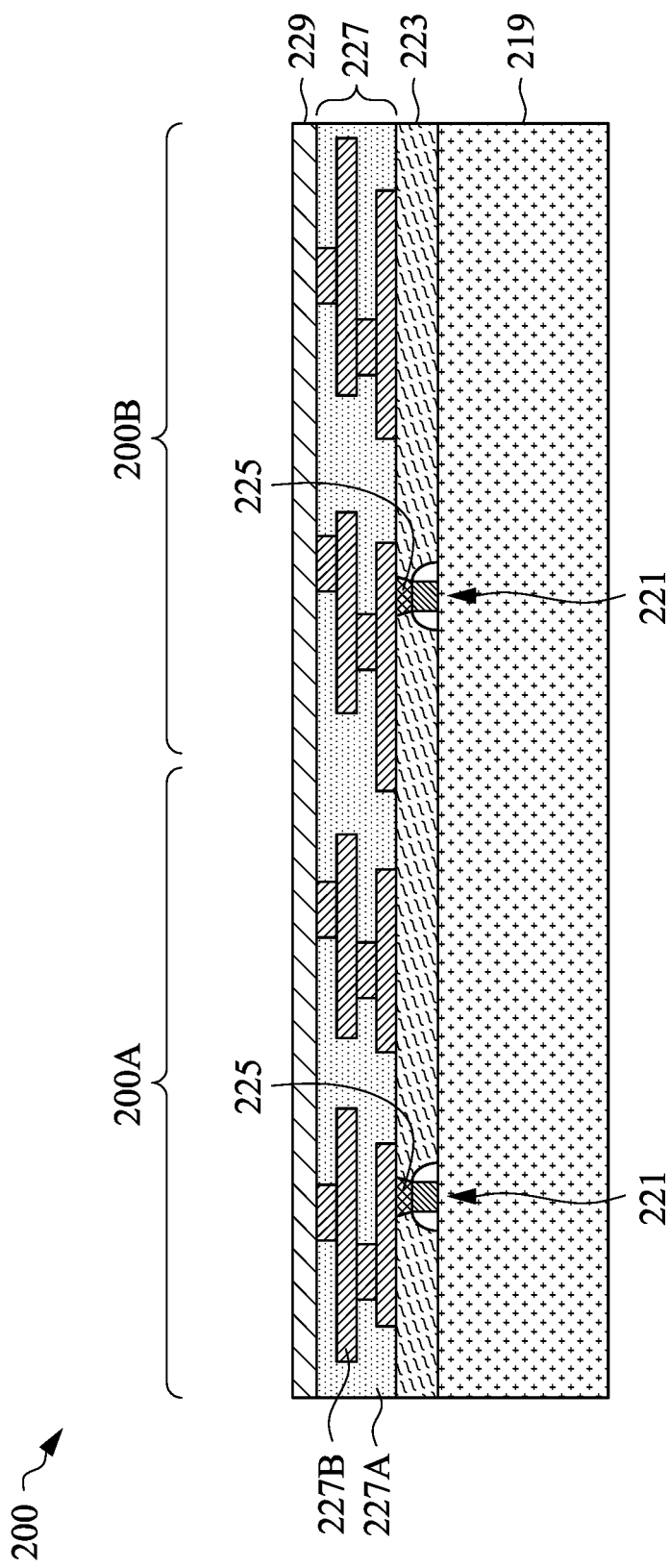

FIGS. 4A and 4B are top and cross-sectional views illustrating a wafer 200 in accordance with some embodiments. In particular, FIG. 2B illustrates a cross-sectional view of a portion of the wafer 200. In some embodiments, the wafer 200 may be formed using similar materials and methods as the wafer 100 described above with reference to FIGS. 1A and 1B, and the description is not repeated herein. In particular, features of the wafer 200 labeled by numerical references 2xx correspond to features of the wafer 100 labeled by numerical references 1xx, and the description is not repeated herein.

As described below in greater detail, the wafer 200 is bonded to the wafer 100. In some embodiments, the wafer 100 may comprise a plurality of ASIC dies, and the wafer 200 may comprise a plurality of SOC dies. In some embodiments, the wafer 100 may comprise a plurality of memory dies, and the wafer 200 may comprise a plurality of logic dies. In some embodiments, the wafer 100 may comprise a plurality of image sensor dies, and the wafer 200 may comprise a plurality of logic dies or a plurality of memory dies. The wafer 100 and the wafer 200 may comprise any suitable dies based on desired characteristics of a stacked device formed through the bonding of the wafer 100 and the wafer 200.

Referring further to FIGS. 1A, 1B, 4A, and 4B, in some embodiments, the wafer 100 further comprises first alignment marks (not shown) and the second wafer 200 comprises second alignment marks (not shown). The first alignment marks and the second alignment marks may be formed in the wafer 100 and the wafer 200, respectively, using any suitable process. The first alignment marks and the second alignment marks will be used to assist in aligning the first wafer 100 with respect to the second wafer 200 before performing a wafer bonding process.

FIG. 5 is a cross-sectional view illustrating a bonding layer 229 in accordance with some embodiments. In some embodiments, the bonding layer 229 comprises an insulating layer 231 formed over the interconnect structure 227 (see FIG. 4B). In some embodiments, the insulating layer 231 may be formed using similar materials and methods as the insulating layer 131 described above with reference to FIG. 2, and the description is not repeated herein.

FIG. 6 is a cross-sectional view illustrating a bonding layer 229 in accordance with some embodiments. In some embodiments, the bonding layer 229 comprises pads 233 embedded in the insulating layer 231. The pads 233 may be also referred to as bond pads. In some embodiments, the pads 233 may be formed using similar materials and methods as the pads 133 described above with reference to FIG. 3, and the description is not repeated herein.

Figure 7:
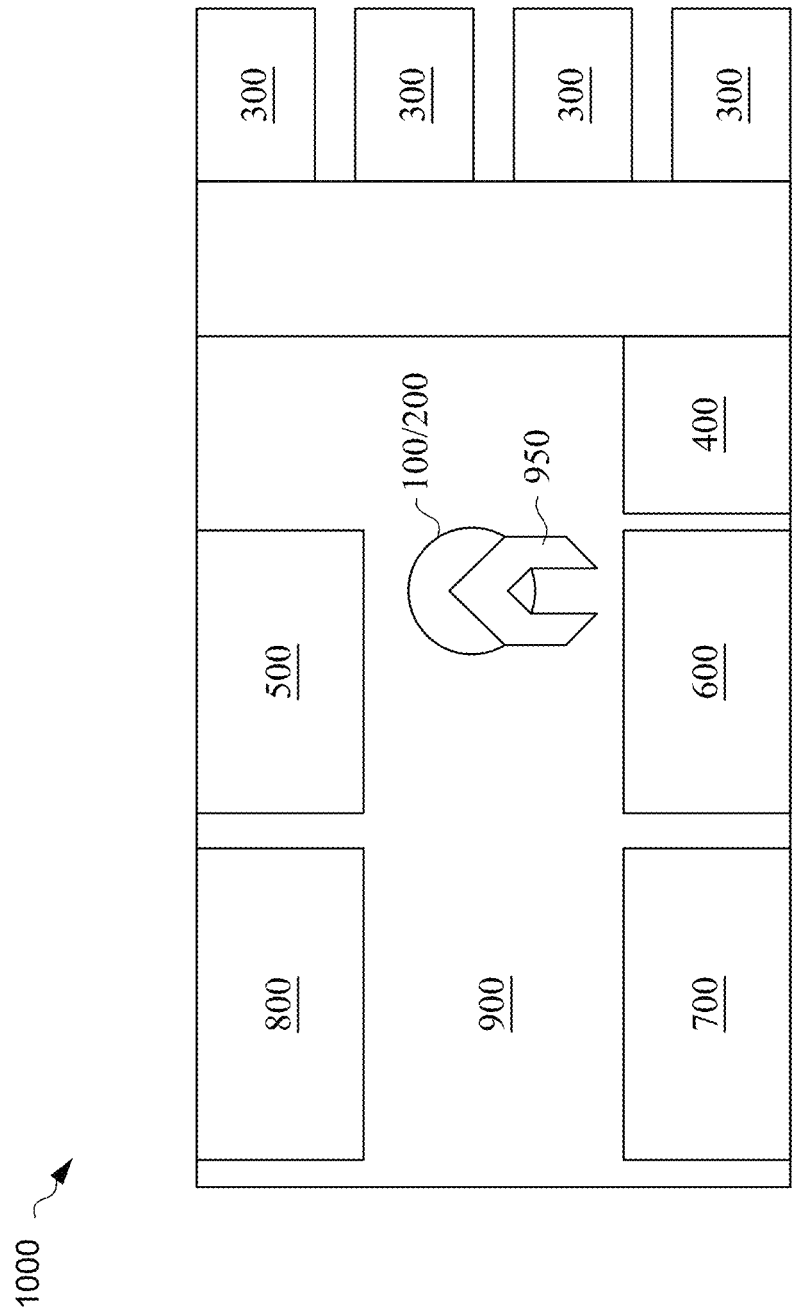
FIG. 7 is a schematic view illustrating a wafer bonding apparatus in accordance with some embodiments.

FIG. 7 is a schematic view illustrating a wafer bonding apparatus 1000 in accordance with some embodiments. In some embodiments, the wafer bonding apparatus 1000 comprises a plurality of load ports 300, an aligner module 400, a plasma module 500, cleaner modules 600 and 700, a bonder module 800, a transfer chamber 900, and one or more robotic arms 950 within the transfer chamber 900. In some embodiments, the wafer bonding apparatus 1000 is a self-enclosed, fully contained system into which the wafers (such as wafers 100 and 200 illustrated in FIGS. 1A-B and 4A-B, respectively) are placed for bonding. In some embodiments, two cleaner modules 600 and 700 allow for preforming cleaning processes on two wafers at the same time. Accordingly, wafer-per-hour (WPH) yield of the wafer bonding apparatus 1000 is improved.

In some embodiments, the wafer bonding apparatus 1000 receives the wafers into the wafer bonding apparatus 1000 through respective loading ports 300. Once within the wafer bonding apparatus 1000, the wafers may be moved from module to module and processed without breaking the interior environment, thereby isolating the wafers from the ambient environment that may contaminate or otherwise interfere with the processing of the wafers. The one or more robotic arms 950 can grip, move, and transfer the wafers between different modules of the wafer bonding apparatus 1000.

In some embodiments, the wafer boding process performed by the wafer bonding apparatus 1000 comprises loading the wafers into the wafer bonding apparatus 1000 through respective loading ports 300. The loading ports 300 open to the exterior atmosphere and receive the wafers to be bonded. Once the wafers are loaded within the respective loading ports 300, the loading ports 300 can close, isolating the wafers from the exterior atmosphere. Once isolated, the loading ports 300 can then have the remaining exterior atmosphere evacuated in preparation for moving the wafers into the remainder of the wafer bonding apparatus 1000 through the transfer chamber 900. In some embodiments, the robotic arm 950 may extend into a respective load port 300 to grip a first wafer (such as, for example, the wafer 100 illustrated in FIGS. 1A and 1B) and transfer the first wafer into the transfer chamber 900. Once inside, the transfer chamber 900 may have doors that close to isolate the transfer chamber 900 from the load ports 300 so that the load ports 300 may again be opened to the exterior atmosphere without contaminating the remainder of the wafer bonding apparatus 1000. Once isolated from the load port 300, the transfer chamber 900 may open to the aligner module 400, and the robotic arm 950, still holding the first wafer, extends into the aligner module 400 to place the first wafer in the aligner module 400 for further processing.

Once the first wafer is placed in the aligner module 400, an aligning process is performed on the first wafer. In some embodiments, the first wafer is rotated to align a notch (such as the notch 101 illustrated in FIG. 1A) of the first wafer along a desired direction. In some embodiments, after completing the aligning process, the robotic arm 950 extends into the aligner module 400, grips the first wafer and transfers the first wafer into the plasma module 500 through the transfer chamber 900 for further processing.

Once the first wafer is placed in the plasma module 500, a plasma activation process is performed on the first wafer. The plasma activation process activates a bonding surface of the first wafer (such as an exposed surface of the bonding layer 129 of the wafer 100 illustrated in FIG. 1B). The structural details of the plasma module 500 and process details of the plasma activation process are described below in greater detail with reference to FIGS. 8A-8E and 9-12. In some embodiments, after completing the plasma activation process, the robotic arm 950 extends into the plasma module 500, grips the first wafer and transfers the first wafer into the cleaner module 600 or 700 through the transfer chamber 900 for further processing.

Once the first wafer is placed in the cleaner module 600 or 700, a cleaning process is performed on the first wafer. The structural details of the cleaner modules 600 and 700 and process details of the cleaning process are described below in greater detail with reference to FIGS. 13 and 14. In some embodiments, after completing the cleaning process, the robotic arm 950 extends into the cleaner module 600 or 700, grips the first wafer and transfers the first wafer into the bonder module 800 through the transfer chamber 900 for further processing.

In some embodiments, the process steps performed on the first wafer are also performed on the second wafer (such as, for example, the wafer 200 illustrated in FIGS. 4A and 4B), and the description is not repeated herein. In some embodiments, the aligner module 400 is used to align a notch of the second wafer (such as the notch 201 illustrated in FIG. 4A) along a same direction as the notch of the first wafer. In some embodiments, the plasma module 500 performs the plasma activation process on both the first wafer and the second wafer. In other embodiments, the plasma module 500 performs the plasma activation process only on the first wafer. In yet other embodiments, the plasma module 500 performs the plasma activation process only on the second wafer.

Once the first wafer and the second wafer are in the bonder module 800, the bonding process is performed on the first wafer and the second wafer. The structural details of the bonder module 800 and process details of the bonding process are described below in greater detail with reference to FIG. 15-20.

Figure 8A:
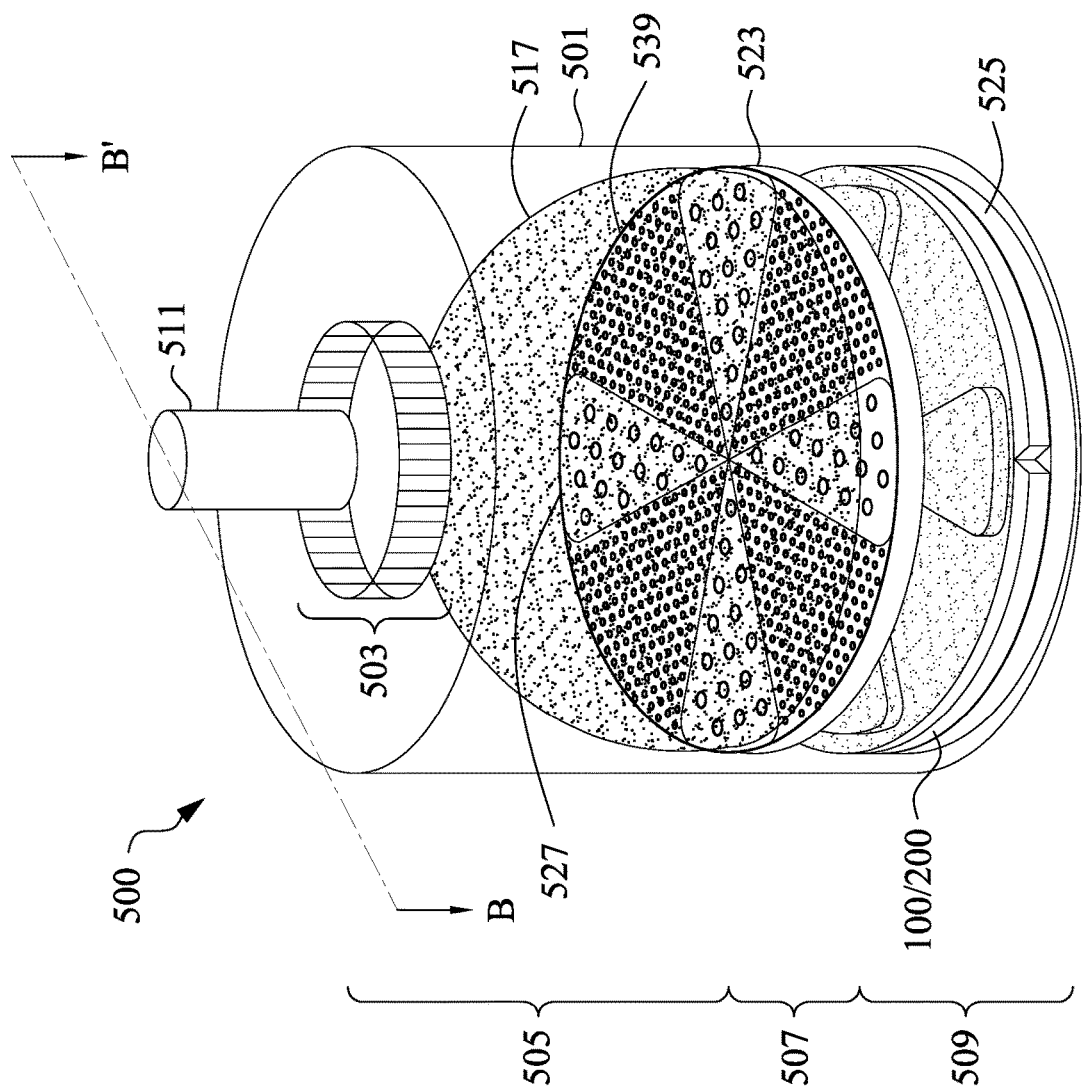
FIGS. 8A-8E and 9-20 are various views illustrating various modules of the wafer bonding tool and a wafer bonding method in accordance with some embodiments.
Figure 8B:
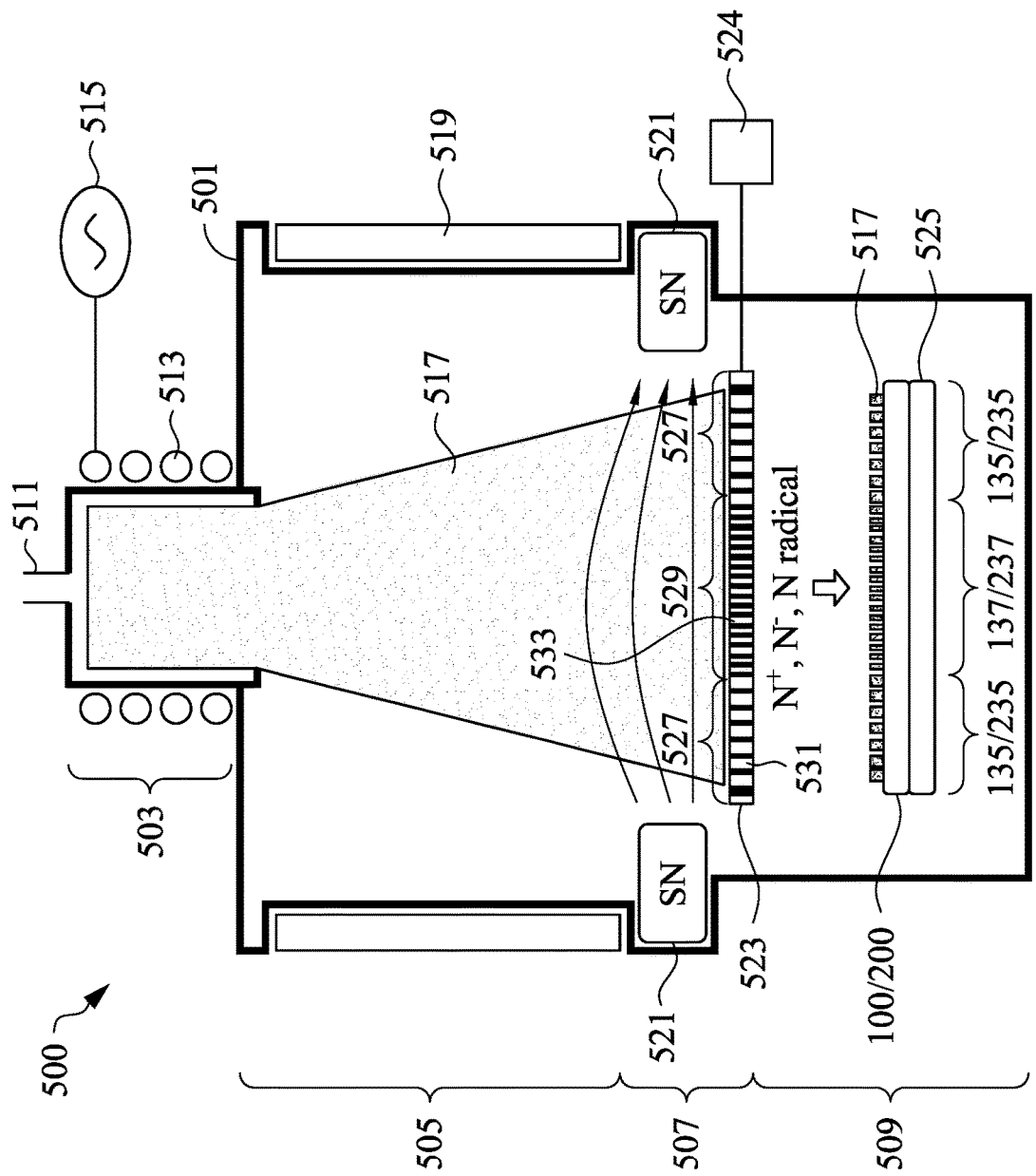
Figure 8C:
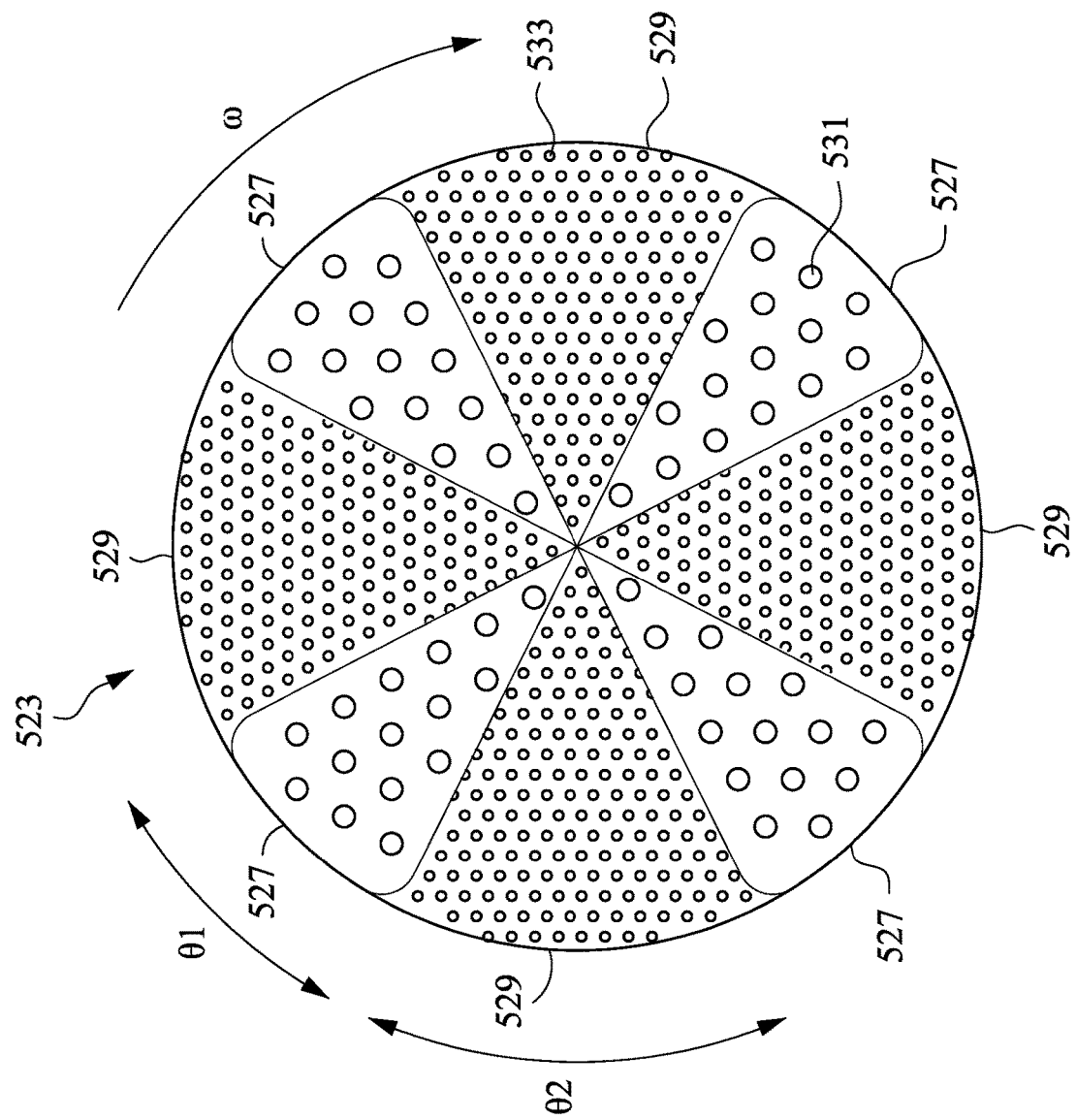
Figure 8D:
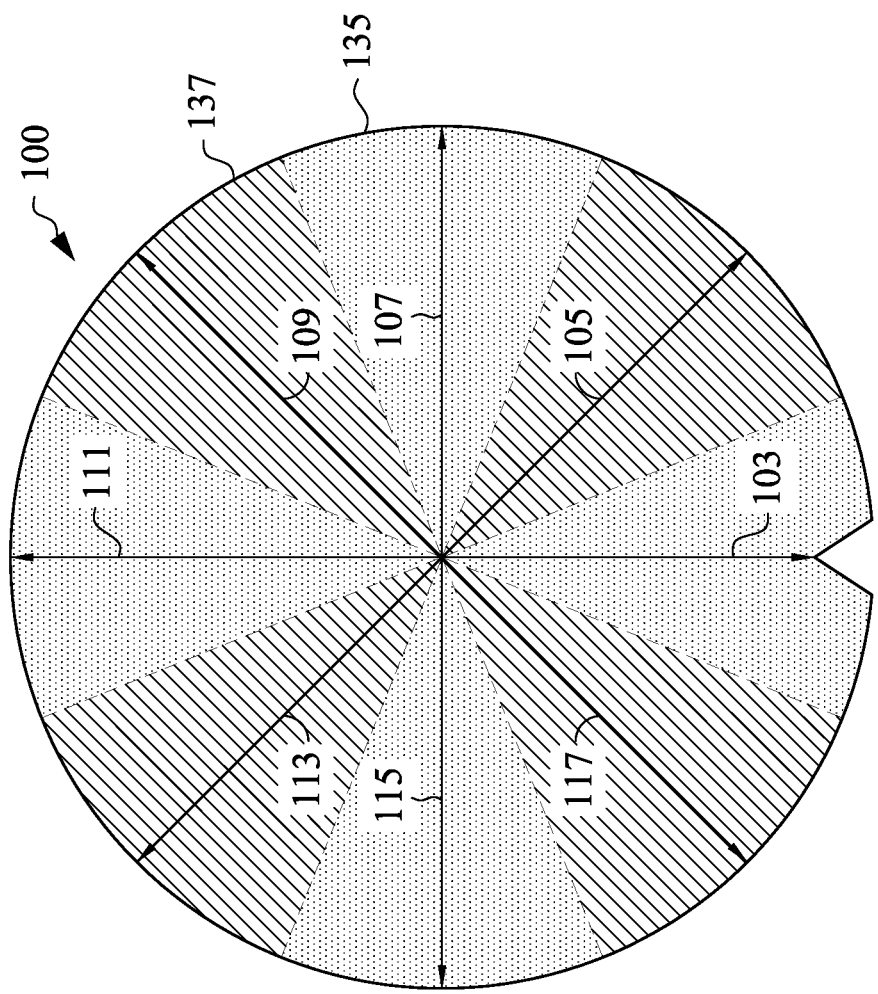
Figure 8E:
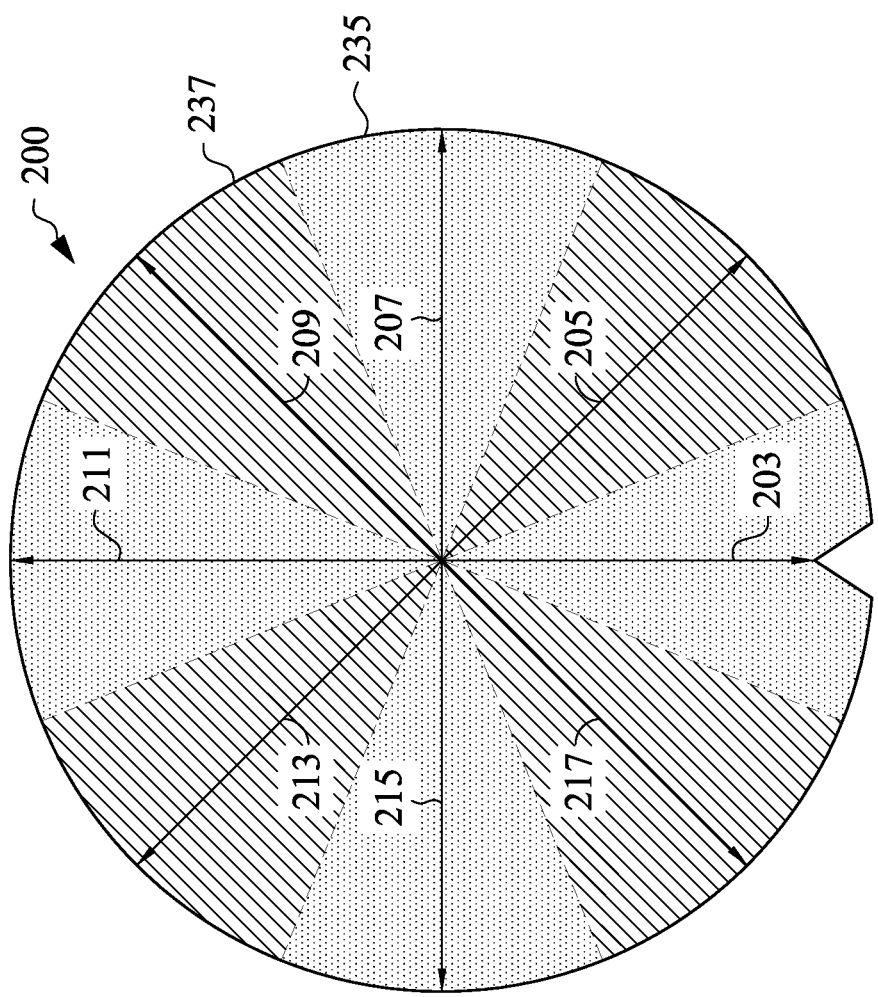

FIGS. 8A-8E illustrate a plasma module 500 and a plasma activation process performed on the first wafer (such as, for example, the wafer 100 illustrated in FIGS. 1A and 1B) or the second wafer (such as, for example, the wafer 200 illustrated in FIGS. 4A and 4B) by the plasma module 500 in accordance with some embodiments. In particular, the FIG. 8A illustrates a perspective view the plasma module 500 in accordance with some embodiments, FIG. 8B illustrates a cross-sectional view of the plasma module 500 along the cross-section BB' illustrated in FIG. 8A in accordance with some embodiments, FIG. 8C illustrates a plan view of a plasma grid assembly 523 in accordance with some embodiments, FIG. 8D illustrates a plan view of the wafer 100 after performing the plasma activation process in accordance with some embodiments, and FIG. 8E illustrates a plan view of the wafer 200 after performing the plasma activation process in accordance with some embodiments.

Referring to FIGS. 8A-8C, in some embodiments, the plasma module 500 comprises a chamber 501. In some embodiments, the plasma module 500 is a remote plasma system, such as an inductively coupled plasma (ICP) system or the like. The chamber 501 comprises a plasma generation region 503, an expansion region 505, an extraction region 507, and a process region 509. The plasma generation region 503 comprises a gas inlet 511 configured to accept a process gas into the plasma generation region 503. The process gas may comprise nitrogen gas ($N_2$), hydrogen gas ($H_2$), an inert gas, forming gas, compressed dry air (CDA), or the like. A radio frequency (RF) coil 513 is wrapped around the plasma generation region 503. In some embodiments, the RF coil 513 is water cooled. A radio frequency (RF) system 515 is coupled to the RF coil 513 to generate plasma 517 within the plasma generation region 503 from the process gas.

After the plasma 517 has been generated in the plasma generation region 503, the plasma 517 extends into the expansion region 505. In some embodiments, a confinement magnetic jacket 519 is wrapped around the expansion region 505. The confinement magnetic jacket 519 may comprises magnets and may be configured to generate a magnetic field within the expansion region 505, which confines and directs the plasma 517 within the expansion region 505.

In some embodiments, the extraction region 507 comprises magnets 521 and a plasma grid assembly 523. The extraction region 507 is configured to alter a direction and amount or flux of ions and/or radicals of the plasma 517 that is extracted into the process regions 509. In some embodiments, the magnets 521 are configured to generate a magnetic field within the extraction region 507. The magnetic field alters a direction of the ions of the plasma 517. The plasma grid assembly 523 may comprise a metallic material and may comprise a plurality of holes. In some embodiments, the plasma grid assembly 523 may be coupled to a voltage source (not shown) and may be biased to have a positive electric potential or a negative electric potential. In other embodiment, the plasma grid assembly 523 may be grounded. In some embodiments when the plasma grid assembly 523 has a positive electric potential, the positive ions of the plasma are repelled from the plasma grid assembly 523 and a flux of negative ions extracted into the process region 509 is greater than a flux of positive ions extracted into the process region 509. In some embodiments when the plasma grid assembly 523 has a negative electric potential, the negative ions of the plasma are repelled from the plasma grid assembly 523 and a flux of negative ions extracted into the process region 509 is less than a flux of positive ions extracted into the process region 509. The plasma grid assembly 523 allows for filtering desired components of the plasma 517 into the process region 509.

In some embodiments, the process region 509 comprises a chuck 525 that is configured to hold the wafer 100 or the wafer 200 during the plasma activation process. The chuck may be a vacuum chuck, an electrostatic chuck, a mechanical chuck, or the like.

Referring to FIG. 8C, the plasma grid assembly 523 may have a similar shape and size in a plan view as the wafer 100 (see FIGS. 1A and 1B) or the wafer 200 (see FIGS. 4A and 4B). In some embodiments, the plasma grid assembly 523 comprises a plurality of coarse mesh regions 527 and a plurality of fine mesh regions 529. In the illustrated embodiment, the plasma grid assembly 523 comprises four coarse mesh regions 527 and four fine mesh regions 529 that are arranged in an alternating manner. Each of the plurality of coarse mesh regions 527 may be a circular sector with an angle θ1. Each of the plurality of fine mesh regions 529 may be a circular sector with an angle θ2. In some embodiments, each of the plurality of coarse mesh regions 527 comprises a plurality of openings 531. The plurality of openings 531 may have a diameter between about 50 μm and about 5 mm. In some embodiment, a total area of the plurality of openings 531 within a coarse mesh region 527 may be between about 10% to about 90% of an area of the coarse mesh region 527. In some embodiments, each of the plurality of fine mesh regions 529 comprises a plurality of openings 533. The plurality of openings 533 may have a diameter between about 10 μm and about 1 mm. In some embodiments, the diameter of plurality of openings 533 is less than the diameter of plurality of openings 531. In some embodiment, a total area of the plurality of openings 533 within a fine mesh region 529 may be between about 10% to about 90% of an area of the fine mesh region 529. In the illustrated embodiment, each of the plurality of openings 531 and 533 has a circular shape in a plan view. In other embodiments, the plurality of openings 531 and 533 may have any desired shapes in a plan view.

Referring further to FIGS. 8A-8C, the plasma grid assembly 523 allows for a modulated plasma flux to be extracted into the process region 509. In particular, the plurality of coarse mesh regions 527 of the plasma grid assembly 523 allow for a greater plasma flux to be extracted into the process region 509 than the plurality of fine mesh regions 529 of the plasma grid assembly 523. Accordingly, areas of the first wafer or the second wafer disposed directly below the plurality of coarse mesh regions 527 are subject to a greater degree of surface activation than areas of the first wafer or the second wafer disposed directly below the plurality of fine mesh regions 529. In some embodiments, areas of the high-activation regions of the first wafer or the second wafer and areas of the low-activation regions of the first wafer or the second wafer may be varied by varying areas of the plurality of coarse mesh regions 527 and areas of the plurality of fine mesh regions 529, respectively. The areas of the coarse mesh regions 527 may be varied by varying the angle θ1. The areas of the fine mesh regions 529 may be varied by varying the angle θ2.

The plasma module 500 may further comprise a motor 524 coupled to the plasma grid assembly 523. In some embodiments, the motor 524 rotates the plasma grid assembly 523 in plane by a desired angle ω to position the coarse mesh regions 527 and the fine mesh regions 529 of the plasma grid assembly 523 directly over desired regions of the first wafer or the second wafer. The motor 524 may be an electric motor, such as an alternating current (AC) motor, a direct current (DC) motor, or the like. In other embodiments, the plasma grid assembly 523 may be rotated manually.

FIG. 8D illustrates a plan view of the wafer 100 after performing the plasma activation process as described above with reference to FIGS. 8A-8C in accordance with some embodiments. In some embodiments, the plasma grid assembly 523 (see FIG. 8C) is rotated by a desired angle ω to align the plurality of coarse mesh regions 527 and the plurality of fine mesh regions 529 of the plasma grid assembly 523 directly above desired regions of the wafer 100. In some embodiments, the plasma grid assembly 523 is rotated such that the plurality of coarse mesh regions 527 overlap with <110> crystallographic directions (such as the directions 103, 107, 111, and 115) of the wafer 100 and the plurality of fine mesh regions 529 overlap with <100> crystallographic directions (such as the directions 105, 109, 113, and 117) of the wafer 100. After performing the plasma activation process, the wafer 100 comprises high-activation regions 135 and the low-activation regions 137. The high-activation regions 135 are directly below respective coarse mesh regions 527 and the low-activation regions 137 are directly below respective fine mesh regions 529. In some embodiments, the high-activation regions 135 have similar plan-view shapes as the respective coarse mesh regions 527 and the low-activation regions 137 have similar plan-view shapes as the respective fine mesh regions 529. The high-activation regions 135 overlap with the <110> crystallographic directions (such as the directions 103, 107, 111, and 115) of the wafer 100 and the low-activation regions 137 overlap with the <100> crystallographic directions (such as the directions 105, 109, 113, and 117) of the wafer 100.

By modulating the plasma activation of the wafer 100, the bond wave propagation speed and the bond strength difference between the <110> crystallographic directions (such as the directions 103, 107, 111, and 115) and the <100> crystallographic directions (such as the directions 105, 109, 113, and 117) is reduced. In some embodiments, the bond wave propagation speed and the bond strength may be similar along the bond strength difference between the <110> crystallographic directions (such as the directions 103, 107, 111, and 115) and the <100> crystallographic directions (such as the directions 105, 109, 113, and 117) after performing the plasma activation process.

FIG. 8E illustrates a plan view of the wafer 200 after performing the plasma activation process as described above with reference to FIGS. 8A-8C in accordance with some embodiments. In some embodiments, the plasma grid assembly 523 (see FIG. 8C) is rotated by a desired angle ω to align the plurality of coarse mesh regions 527 and the plurality of fine mesh regions 529 of the plasma grid assembly 523 directly above desired regions of the wafer 200. In some embodiments, the plasma grid assembly 523 is rotated such that the plurality of coarse mesh regions 527 overlap with the <110> crystallographic directions (such as the directions 203, 207, 211, and 215) of the wafer 200 and the plurality of fine mesh regions 529 overlap with the <100> crystallographic directions (such as the directions 205, 209, 213, and 217) of the wafer 200. After performing the plasma activation process, the wafer 200 comprises high-activation regions 235 and the low-activation regions 237. The high-activation regions 235 are directly below respective coarse mesh regions 527 and the low-activation regions 237 are directly below respective fine mesh regions 529. In some embodiments, the high-activation regions 235 have similar plan-view shapes as the respective coarse mesh regions 527 and the low-activation regions 237 have similar plan-view shapes as the respective fine mesh regions 529. The high-activation regions 235 overlap with the <110> crystallographic directions (such as the directions 203, 207, 211, and 215) of the wafer 200 and the low-activation regions 237 overlap with the <100> crystallographic directions (such as the directions 205, 209, 213, and 217) of the wafer 200.

By modulating the plasma activation of the wafer 200, the bond wave propagation speed and the bond strength difference between the <110> crystallographic directions (such as the directions 203, 207, 211, and 215) and the <100> crystallographic directions (such as the directions 205, 209, 213, and 217) is reduced. In some embodiments, the bond wave propagation speed and the bond strength may be similar along the bond strength difference between the <110> crystallographic directions (such as the directions 203, 207, 211, and 215) and the <100> crystallographic directions (such as the directions 205, 209, 213, and 217) after performing the plasma activation process.

Figure 9:
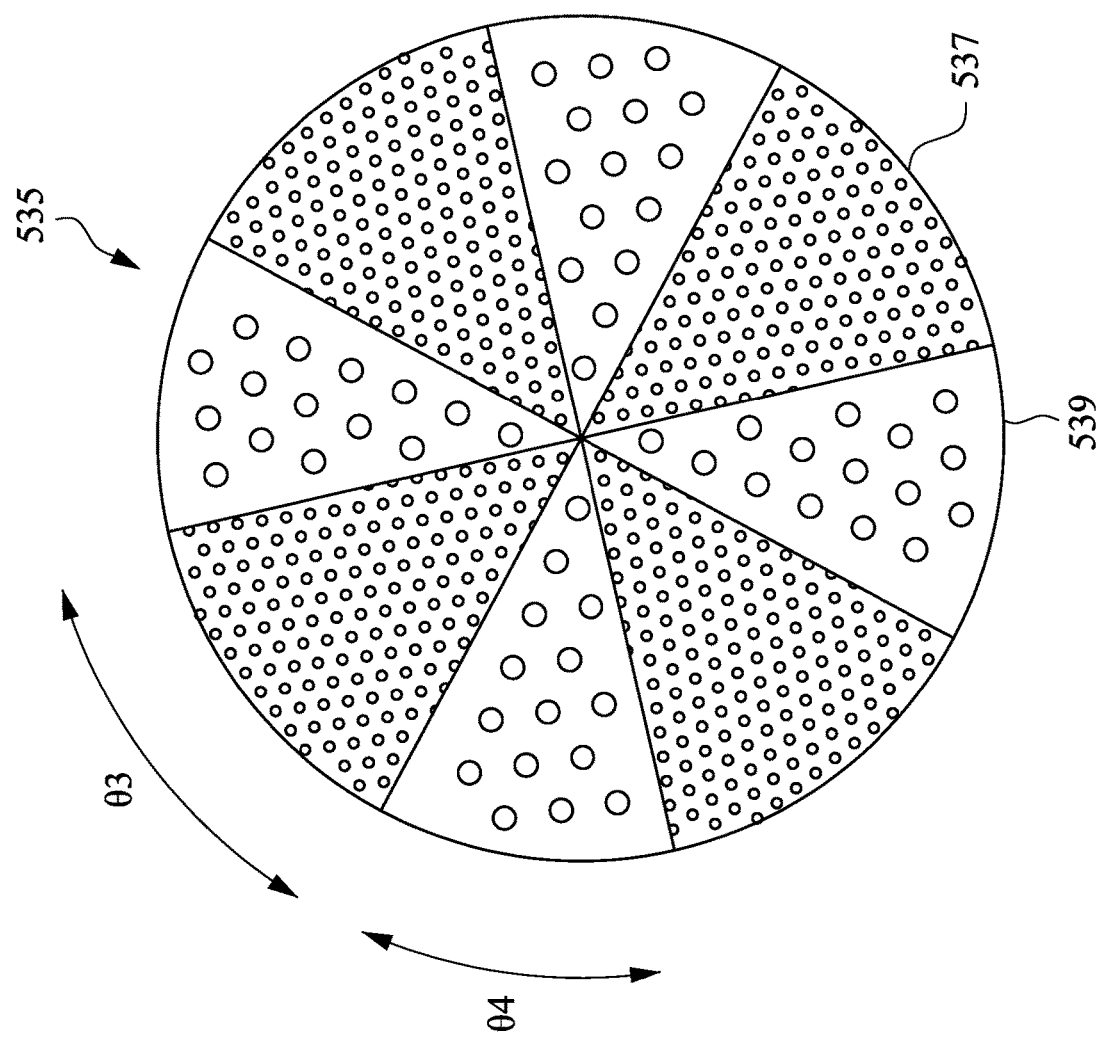

FIG. 9 illustrates a plan view of a plasma grid assembly 535 in accordance with some embodiments. In some embodiments, the plasma grid assembly 535 comprises a plurality of coarse mesh regions 537 and a plurality of fine mesh regions 539. Each of the plurality of coarse mesh regions 537 may be a circular sector with an angle θ3. Each of the plurality of fine mesh regions 539 may be a circular sector with an angle θ4. The coarse mesh regions 537 may be similar to the coarse mesh regions 527 (see FIG. 8C). The fine mesh regions 539 may be similar to the fine mesh regions 529 (see FIG. 8C). In the illustrated embodiment, the angle θ3 is greater than angle θ1 and the angle θ4 is less than angle θ2 (see FIG. 8C). Accordingly, the coarse mesh regions 537 have greater areas than the coarse mesh regions 527 (see FIG. 8C) and the fine mesh regions 539 have lesser areas than fine mesh regions 529 (see FIG. 8C). The plasma grid assembly 535 allows for generating high-activation regions on a wafer having greater areas than high-activation regions generated using the plasma grid assembly 523 (see FIG. 8C). The plasma grid assembly 535 allows for generating low-activation regions on a wafer having lesser areas than low-activation regions generated using the plasma grid assembly 523 (see FIG. 8C).

Figure 10:
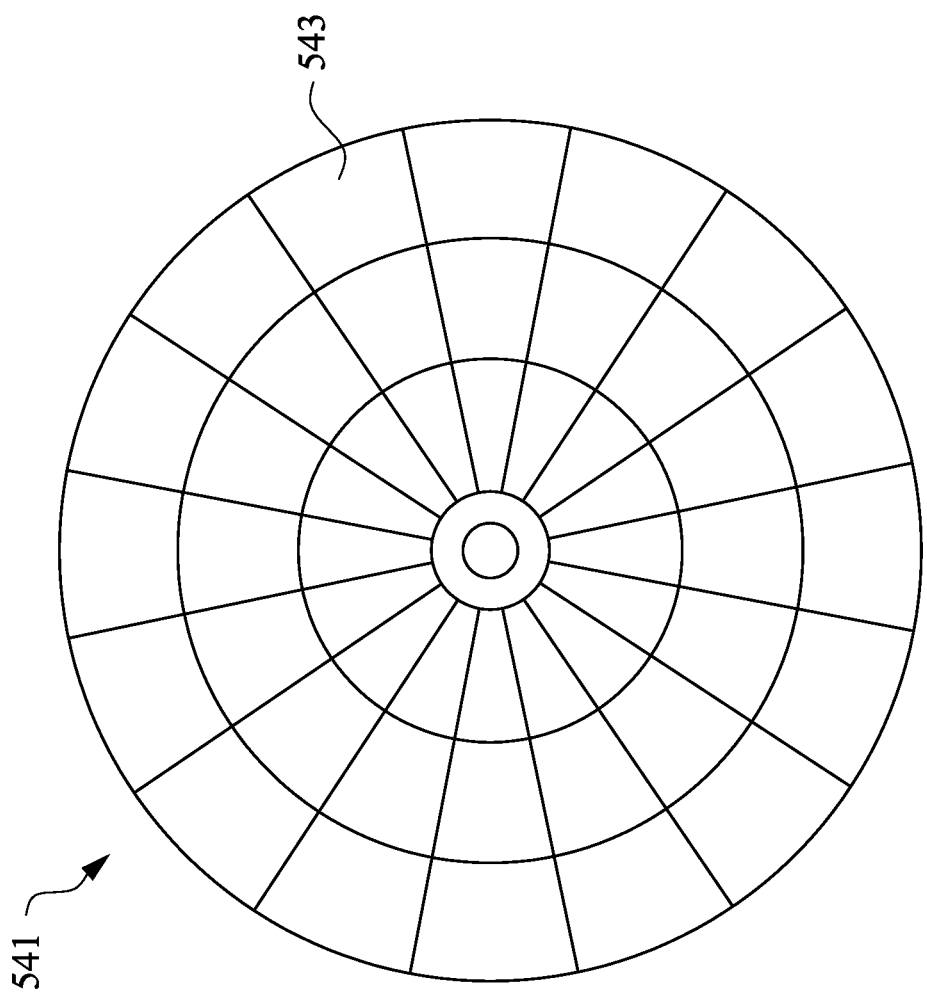

FIG. 10 illustrates a plan view of a plasma grid assembly 541 in accordance with some embodiments. The plasma grid assembly 541 comprises a plurality of regions 543. The plasma grid assembly 541 is divided into 16 circular sectors and each of the circular sectors is divided into 3 concentric regions, wherein the first region is at the center of the plasma grid assembly 541, the second regions is at the edge of the plasma grid assembly 541 and the third region interposed between the first region and the second region. Each of the regions 543 may be a coarse mesh region or a fine mesh region. The coarse mesh regions and the fine mesh regions may be arranged according to characteristics of a wafer to be subjected to a plasma activation process.

Figure 11:
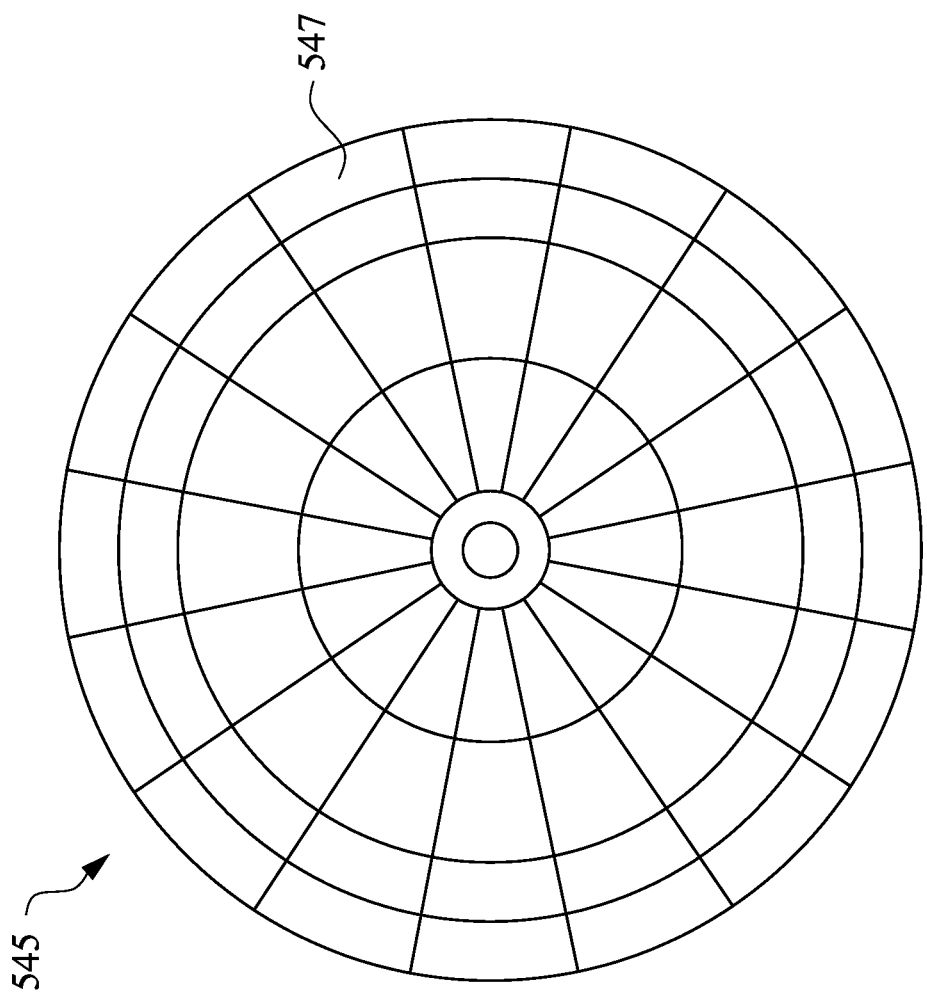

FIG. 11 illustrates a plan view of a plasma grid assembly 545 in accordance with some embodiments. The plasma grid assembly 545 comprises a plurality of regions 547. The plasma grid assembly 545 is divided into 8 circular sectors and each of the circular sector is divided into 4 concentric regions, wherein the first region is at the center of the plasma grid assembly 545, the second regions is at the edge of the plasma grid assembly 545, the third region interposed between the first region and the second region, and the fourth region is interposed between the third region and the second region. Each of the regions 547 may be a coarse mesh region or a fine mesh region. The coarse mesh regions and the fine mesh regions may be arranged according to characteristics of a wafer to be subjected to a plasma activation process.

Figure 12:
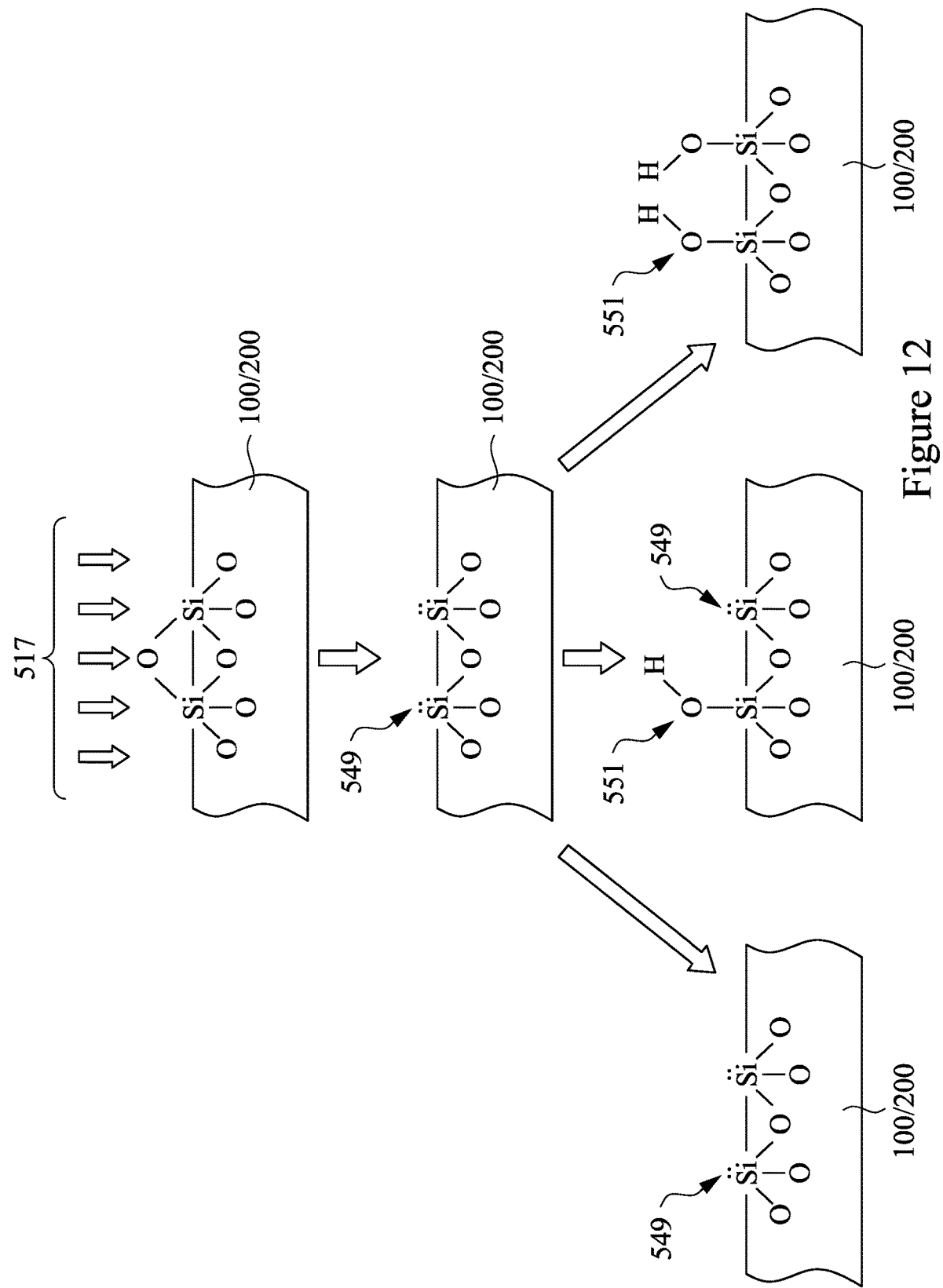

FIG. 12 illustrates modifications of a surface of a wafer (such as the first wafer 100 illustrated in FIGS. 1A and 1B or the second wafer 200 illustrated FIGS. 4A and 4B) during the plasma activation process (see FIGS. 8A-8E) performed on the wafer in accordance with some embodiments. In some embodiments when a bonding layer of the wafer comprises silicon oxide, the plasma 517, after passing through the plasma grid assembly 523 (see FIGS. 8A-8C), impinges upon the surface of the wafer, breaks Si—Si and/or Si—O bonds and forms Si dangling bonds 549 on the surface of the wafer. The high-activation regions of the wafer comprise a greater number of Si dangling bonds 549 than the low-activation regions of the wafer. As described below in greater detail, after performing the plasma activation process, the wafer is transferred from the plasma module 500 (see FIGS. 7, 8A, and 8B) into the cleaner module 600 or 700 (see FIGS. 7 and 13) through the transfer chamber 900 (see FIG. 7). In some embodiments, the Si dangling bonds 549 react with water molecules ($H_2O$) within an ambient atmosphere of the transfer chamber 900 and form silanol groups (Si—O—H) 551 on the surface of the wafer. In such embodiments, depending on the amount of water molecules ($H_2O$) within the ambient atmosphere of the transfer chamber 900, none, some, or all of the Si dangling bonds 549 may react with water molecules ($H_2O$) to form silanol groups 551. In some embodiments when all of the Si dangling bonds 549 react with water molecules ($H_2O$) to form silanol groups 551, the high-activation regions of the wafer comprise a greater number of silanol groups 551 than the low-activation regions of the wafer.

Figure 13:
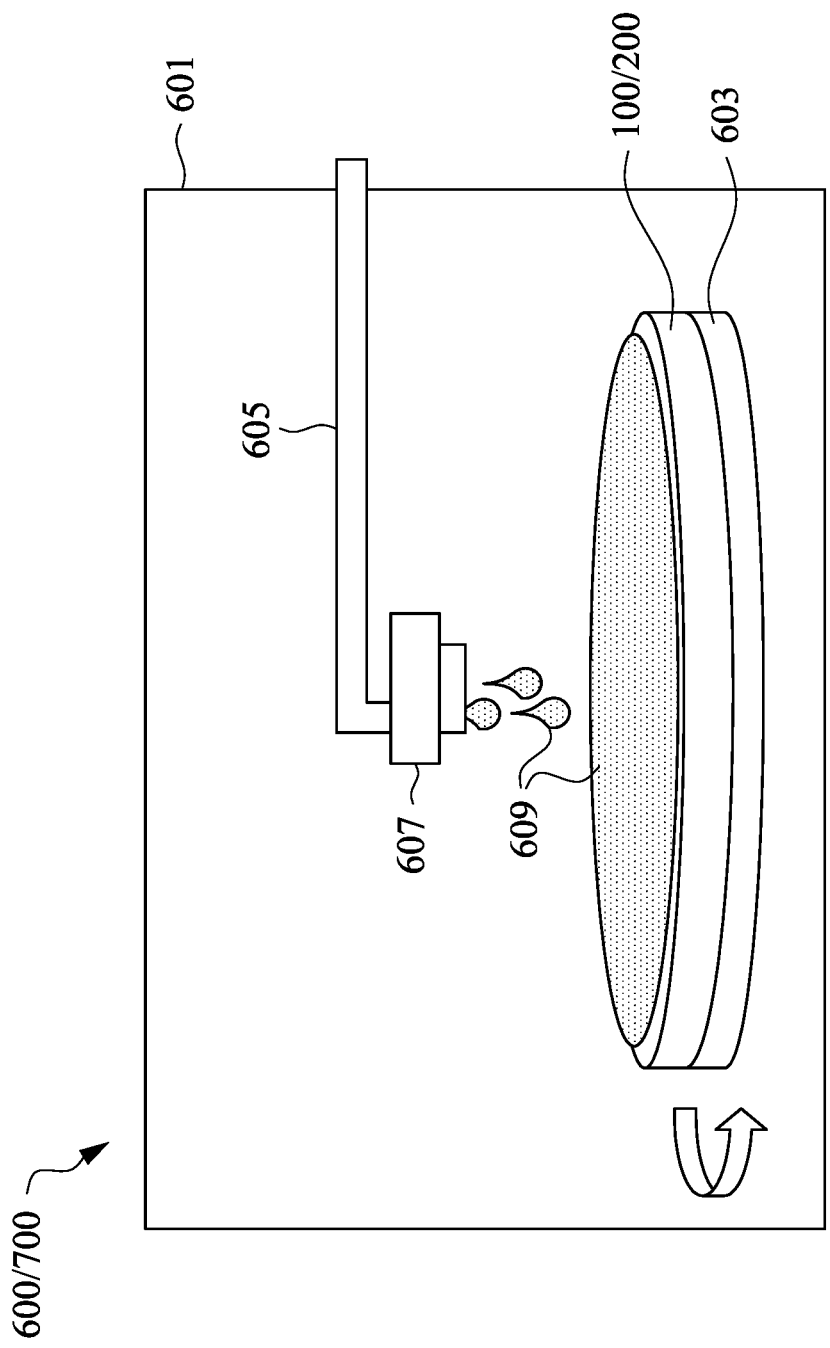

FIG. 13 illustrates a cleaner module 600 or 700 and a cleaning process performed on a wafer (such as the first wafer 100 illustrated in FIGS. 1A and 1B or the second wafer 200 illustrated FIGS. 4A and 4B) by the cleaner module 600 or 700 in accordance with some embodiments. The cleaning process may also be referred to as a rinsing process. After performing the plasma activation process as described above with reference to FIGS. 8A-8E, the wafer is transferred from the plasma module 500 (see FIGS. 7, 8A, and 8B) into the cleaner module 600 or 700 through the transfer chamber 900 (see FIG. 7).

In some embodiments, the cleaner module 600 or 700 comprises a chamber 601 and a chuck 603 within the chamber 601. The chuck 603 receives the wafer from the transfer chamber 900 (see FIG. 7) and holds the wafer during processing. In some embodiments, the chuck 603 may be a vacuum chuck, an electrostatic chuck, a mechanical chuck, or the like. In some embodiments, the chuck 603 maybe a rotating chuck and may be configured to rotate with the wafer placed thereon during the cleaning process.

The cleaner module 600 or 700 further comprises a dispensing arm 605 within the chamber 601. The dispensing arm 605 has a nozzle 607 in order to dispense de-ionized (DI) water ($H_2O$) 609 onto the wafer. In some embodiments, the dispensing arm 605 may be moveable relative to the chuck 603 so that the dispensing arm 605 can move over the wafer in order to evenly dispense the DI water 609 over the wafer. The dispensing arm 605 may move back and forth with the help of a track (not shown), which provides a fixed reference to assist the dispensing arm 605 in its movement.

During the cleaning process, the chuck 603, holding the wafer, may rotate at a speed of about 10 rpms to about 10000 rpms, although any suitable speed may be utilized. While the chuck 603 is rotating, the dispensing arm 605 may move over the wafer and begin dispensing the DI water 609 onto the wafer through the nozzle 607. The rotation of the wafer helps the DI water 609 to spread evenly across the wafer and to remove excess amount of the DI water 609 from the wafer.

Figure 14:
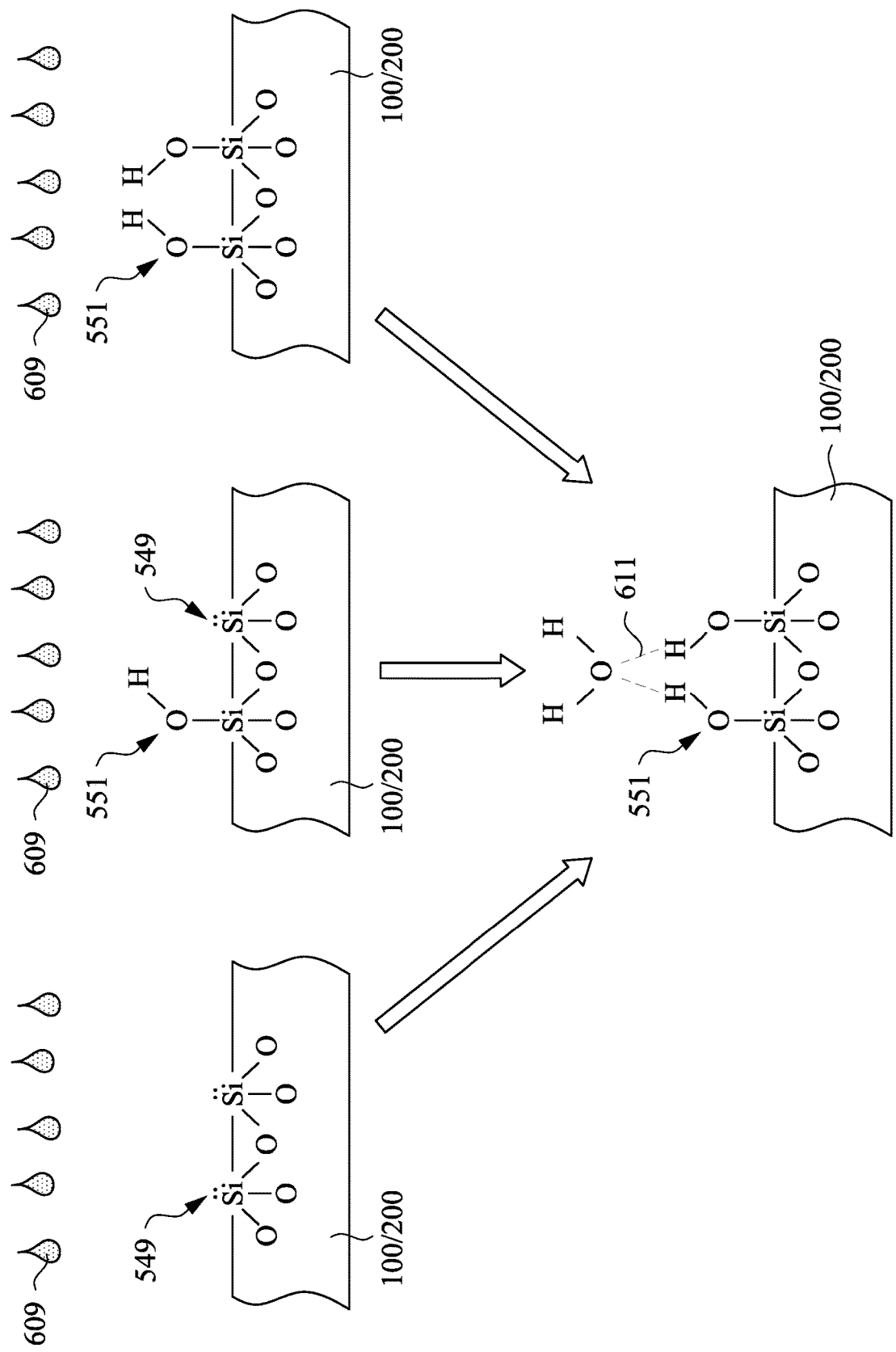

FIG. 14 illustrates modifications of a surface of a wafer (such as the wafer 100 illustrated in FIGS. 1A and 1B or the wafer 200 illustrated FIGS. 4A and 4B) during the cleaning process (see FIG. 13) performed on the wafer in accordance with some embodiments. In some embodiments when all of the Si dangling bonds 549 remain unreacted after transferring the wafer into the cleaner module 600 or 700 (see FIG. 13), during the cleaning process, the Si dangling bonds 549 react with water molecules ($H_2O$) of the DI water 609 to form the silanol groups (Si—O—H) 551 on the surface of the wafer. Furthermore, the silanol groups 551 assist in adsorption of water molecules ($H_2O$) onto the surface of the wafer by bonding oxygen atoms (O) of water molecules ($H_2O$) to hydrogen atoms (H) of the silanol groups 551 by the Van der Waals or dipole force 611.

In some embodiments when some of the Si dangling bonds 549 remain unreacted after transferring the wafer into the cleaner module 600 or 700 (see FIG. 13), during the cleaning process, remaining Si dangling bonds 549 react with water molecules ($H_2O$) of the DI water 609 to form the silanol groups (Si—O—H) 551 on the surface of the wafer. Furthermore, the silanol groups 551 assist in adsorption of water molecules ($H_2O$) onto the surface of the wafer by bonding oxygen atoms (O) of water molecules ($H_2O$) to hydrogen atoms (H) of the silanol groups 551 by the Van der Waals or dipole force 611.

In some embodiments when none of the Si dangling bonds 549 remain unreacted after transferring the wafer into the cleaner module 600 or 700 (see FIG. 13), during the cleaning process, the silanol groups 551 assist in adsorption of water molecules ($H_2O$) onto the surface of the wafer by bonding oxygen atoms (O) of water molecules ($H_2O$) to hydrogen atoms (H) of the silanol groups 551 by the Van der Waals or dipole force 611.

After performing the cleaning process, the high-activation regions of the wafer comprise a greater number of silanol groups 551 than the low-activation regions of the wafer. In some embodiments when the plasma activation process is performed on both the first wafer 100 and the second wafer 200, higher amount of silanol groups 551 from the first wafer 100 and the second wafer 200 provide improved bond strength between the first wafer 100 and the second wafer 200.

FIGS. 15-18 illustrate a bonder module 800 and a bonding process of a first wafer (such as the wafer 100 illustrated in FIGS. 1A and 1B) to a second wafer (such as the wafer 200 illustrated in FIGS. 4A and 4B) performed by the bonder module 800 in accordance with some embodiments.

Figure 15:
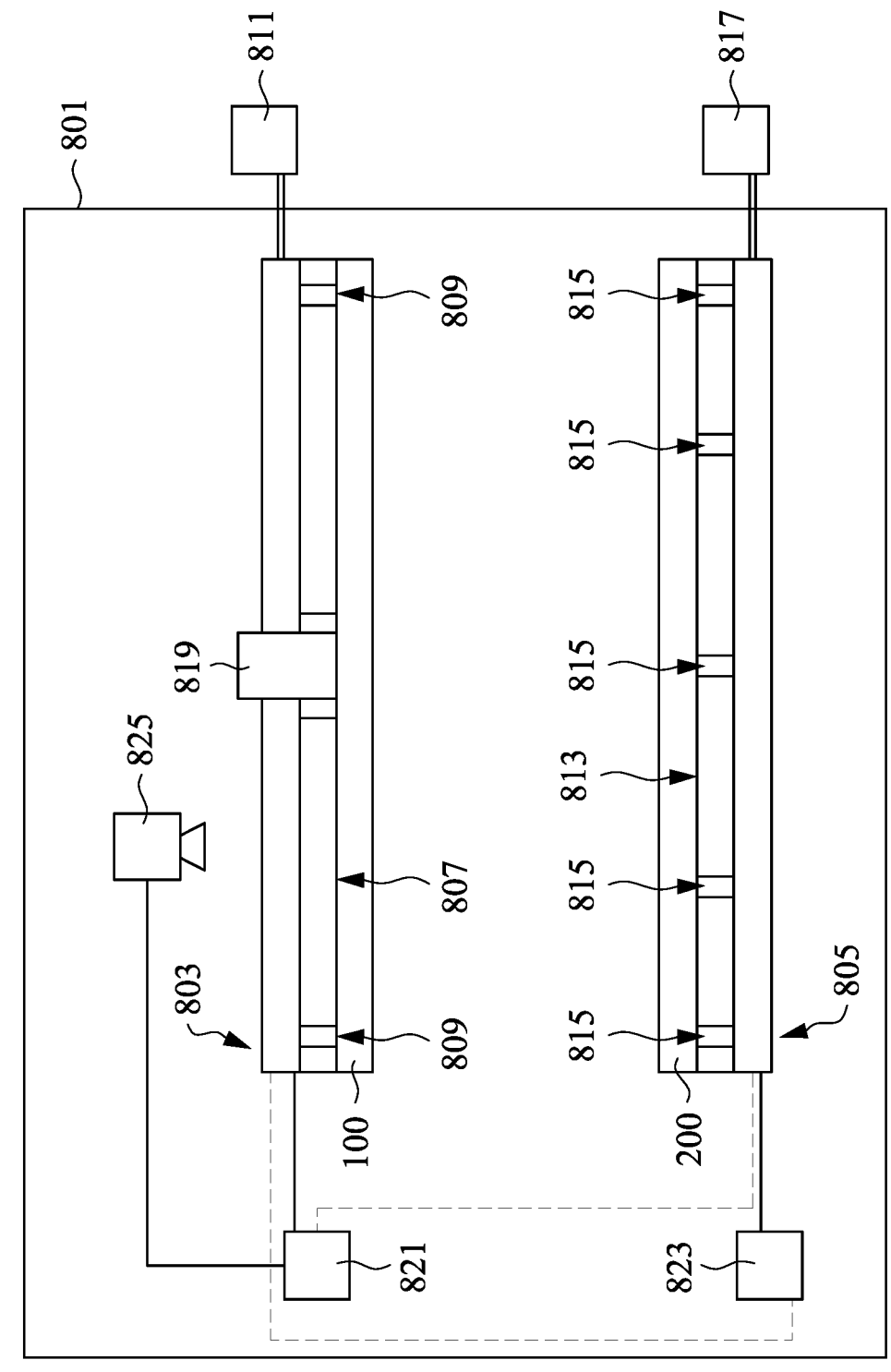

Referring to FIG. 15, the bonder module 800 comprises a chamber 801 and a first chuck 803 and a second chuck 805 within the chamber 801. In some embodiments, the first chuck 803 and second chuck 805 comprise silicon based materials, such as glass, silicon oxide, silicon nitride, other materials, such as aluminum oxide, combinations of any of these materials, or the like. The first chuck 803 may have a diameter that is suitable to hold the first wafer 100, and the diameter of the first chuck 803 may vary according to a diameter of the first wafer 100. The second chuck 805 may have a diameter that is suitable to hold the second wafer 200, and the diameter of the second chuck 805 may vary according to a diameter of the second wafer 200.

In some embodiments, the first chuck 803 and the second chuck 805 are vacuum chucks. In such embodiments, the first chuck 803 has first openings 809 along a first surface 807 of the first chuck 803 and the second chuck 805 has second openings 815 along a second surface 813 of the second chuck 805. In some embodiments, the first openings 809 are connected to a first vacuum pump 811. During operation, the first vacuum pump 811 evacuates any gases from the first openings 809 of the first chuck 803, thereby lowering the pressure within the first openings 809 relative to the ambient pressure. When the first wafer 100 is placed against the first surface 807 of the first chuck 803 and the pressure within the first openings 809 has been reduced by the first vacuum pump 811, the pressure difference between the side of the first wafer 100 facing the first openings 809 and the side of the first wafer 100 facing away from the first openings 809 will hold the first wafer 100 against the first surface 807 of the first chuck 803. In some embodiments, the first chuck 803 has a pin 819 that extends through the first chuck 803 in order to warp the first wafer 100 after the first wafer 100 has been attached to the first chuck 803, as explained below in greater detail.

In some embodiments, the second openings 815 of the second chuck 805 are connected to a second vacuum pump 817. During operation, the second vacuum pump 817 evacuates any gases from the second openings 815, thereby lowering the pressure within the second openings 815 relative to the ambient pressure. When the second wafer 200 is placed against the second surface 813 of the second chuck 805 and the pressure within the second openings 815 has been reduced by the second vacuum pump 817, the pressure difference between the side of the second wafer 200 facing the second openings 815 and the side of the second wafer 200 facing away from the second openings 815 will hold the second wafer 200 against the second surface 813 of the second chuck 805. In other embodiments, the first chuck 803 and the second chuck 805 may be electrostatic chucks, mechanical chucks, or the like.

Referring further to FIG. 15, a motor 821 may be coupled to each of the first chuck 803 and the second chuck 805 in accordance with some embodiments. In some embodiments, one motor 821 may be coupled to both or only one of the first chuck 803 and the second chuck 805. The motor 821 may comprise a piezoelectric motor, a linear motor, or the like. Alternatively, the motor 821 may comprise other types of motors. The motor 821 is adapted to adjust an x position, a y position, a z position, and/or an angular position of the first chuck 803 relative to the second chuck 805, and thus the first wafer 100 relative to the second wafer 200. In addition, in some embodiments, the motor 821 is coupled to the pin 819, and may control a length of a portion of the pin 819 that extends through the first chuck 803.

In some embodiments, the bonder module 800 further comprises a thermal controller 823 for thermally controlling the first wafer 100 or the second wafer 200. In some embodiments, the thermal controller 823 may be coupled to the first chuck 803 or the second chuck 805. In other embodiments, the thermal controller 823 may be coupled both to the first chuck 803 and the second chuck 805. In embodiments when the thermal controller 823 is coupled to the first chuck 803, the thermal controller 823 is adapted to thermally control the first wafer 100. In embodiments when the thermal controller 823 is coupled to the second chuck 805, the thermal controller 823 is adapted to thermally control the second wafer 200. In some embodiments, the thermal controller 823 is not included for the bonder module 800.

In some embodiments, the thermal controller 823 comprises a thermal couple or a thermal plate in some embodiments. Alternatively, the thermal controller 823 may comprise other devices or instruments adapted to control a temperature of the first wafer 100 or a temperature of the second wafer 200. The thermal controller 823 may be used to compensate a thermal expansion of the first wafer 100 and the second wafer 200.

Additionally, in some embodiments, an alignment monitor 825 is connected to the motor 821 using, e.g., wiring. The alignment monitor 825 can emit infrared (IR) energy towards and through, e.g., the first chuck 803 in order to check the alignment of the first wafer 100 and the second wafer 200. This information may then be passed to the motor 821 in order to perform any corrections that may be desired prior to completing bonding of the first wafer 100 and the second wafer 200.

Referring further to FIG. 15, after performing the cleaning process on the first wafer 100 and the second wafer 200 as described above with reference to FIG. 13, the first wafer 100 and the second wafer 200 are placed onto the first chuck 803 and the second chuck 805, respectfully. Once the first wafer 100 is in place on the first chuck 803, the first vacuum pump 811 is initiated, lowering the pressure within the first openings 809 relative to the ambient pressure, and holding the first wafer 100 to the first chuck 803. In some embodiments, the first wafer 100 may be intrinsically warped and the shape of the first wafer 100 may change when the first vacuum pump 811 is initiated and may conform to the shape of the first surface 807 of the first chuck 803.

Once the second wafer 200 is in place on the second chuck 805, the second vacuum pump 817 is initiated, lowering the pressure within the second openings 815 relative to the ambient pressure, and holding the second wafer 200 to the second chuck 805. In some embodiments, the second wafer 200 may be intrinsically warped and the shape of the second wafer 200 may change when the second vacuum pump 817 is initiated and may conform to the shape of the second surface 813 of the second chuck 805.

As described above in greater detail with reference to FIG. 7, the aligner module 400 aligns the first wafer 100 and the second wafer 200, such that after the first wafer 100 and the second wafer 200 have been placed onto the first chuck 803 and the second chuck 805, respectfully, the notch 101 (see FIG. 1A) of the first wafer 100 is aligned to the notch 201 (see FIG. 4A) of the second wafer 200. Such an alignment of the first wafer 100 to the second wafer 200 provides a coarse alignment between the first wafer 100 and the second wafer 200, which may not meet desired specification for alignment between the first wafer 100 and the second wafer 200.

In some embodiments, a fine alignment is performed to provide desired alignment between the first wafer 100 and the second wafer 200 before bonding. In some embodiments, the alignment monitor 825 is activated to emit the IR or visible electromagnetic energy towards and through the first chuck 803, the first wafer 100, and a first alignment marks (not shown) on the first wafer 100 to the second alignment marks (not shown) on the second wafer 200. The motor 821 receives the information regarding the location of the second wafer 200 from the alignment monitor 825 and adjusts the position of the second wafer 200 relative to the position of the first wafer 100 until the alignment marks of the second wafer 200 are aligned to the alignment marks the first wafer 100.

Figure 16:
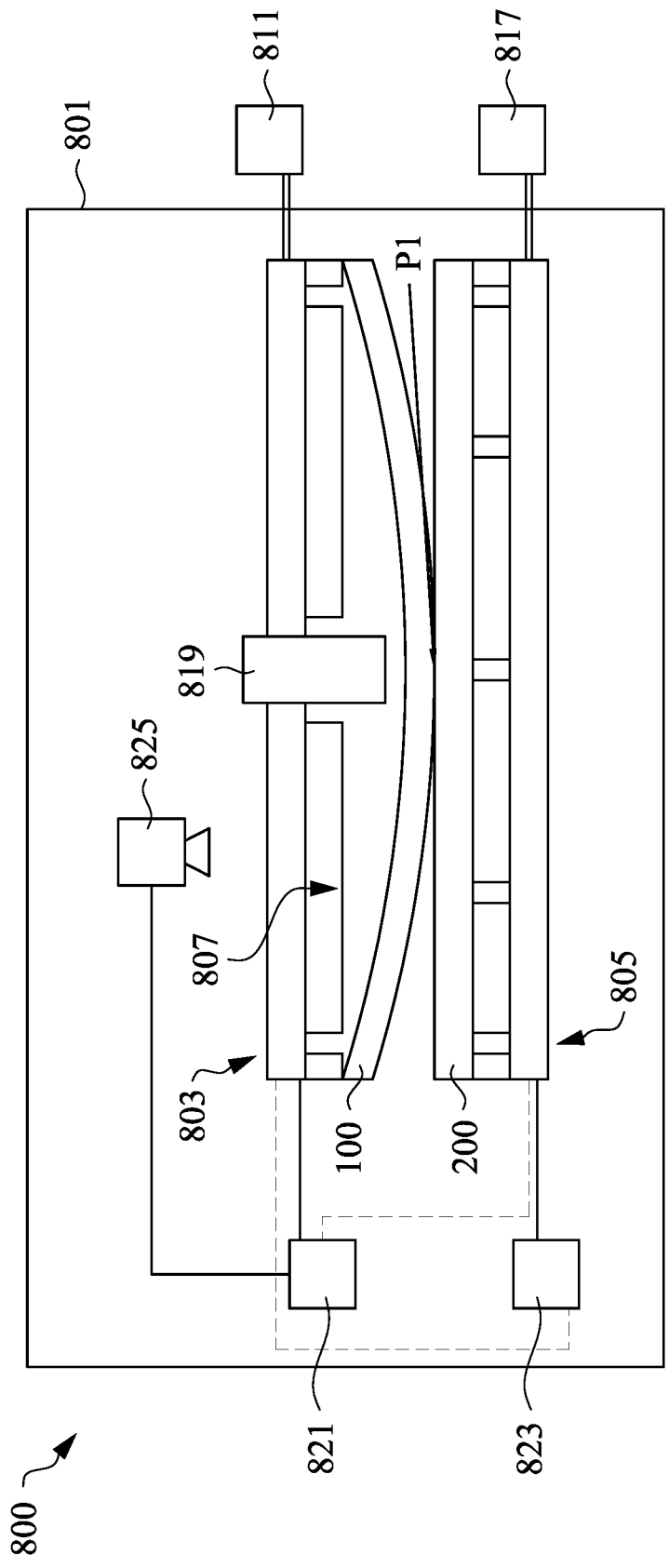

Referring to FIG. 16, after aligning the first wafer 100 with respect to the second wafer 200, the pin 819 is extended by the motor 821, contacts the side of the first wafer 100 that is attached to the first surface 807 of the first chuck 803 and warps the first wafer 100. In some embodiments, the first wafer 100 is warped to a concave shape with a center of the first wafer 100 being lower than edges of the first wafer 100. A curvature of the first wafer 100 may vary according to design specifications of bonded wafers.

In some embodiments, after the first wafer 100 has been warped, the first wafer 100 and the second wafer 200 are brought into contact at a first point P1 using the motor 821. Once in contact, the first wafer 100 and the second wafer 200 will begin to bond at the first point P1. In some embodiments, the first chuck 803 and the second chuck 805 are used to apply a force to bonded wafers to facilitate the bonding process. In some embodiment, the force may be between about 100 mN and about 5000 mN. Additionally, if desired, heat may be applied to the bonded wafers using the thermal controller 823 to facilitate the bonding process.

Figure 17:
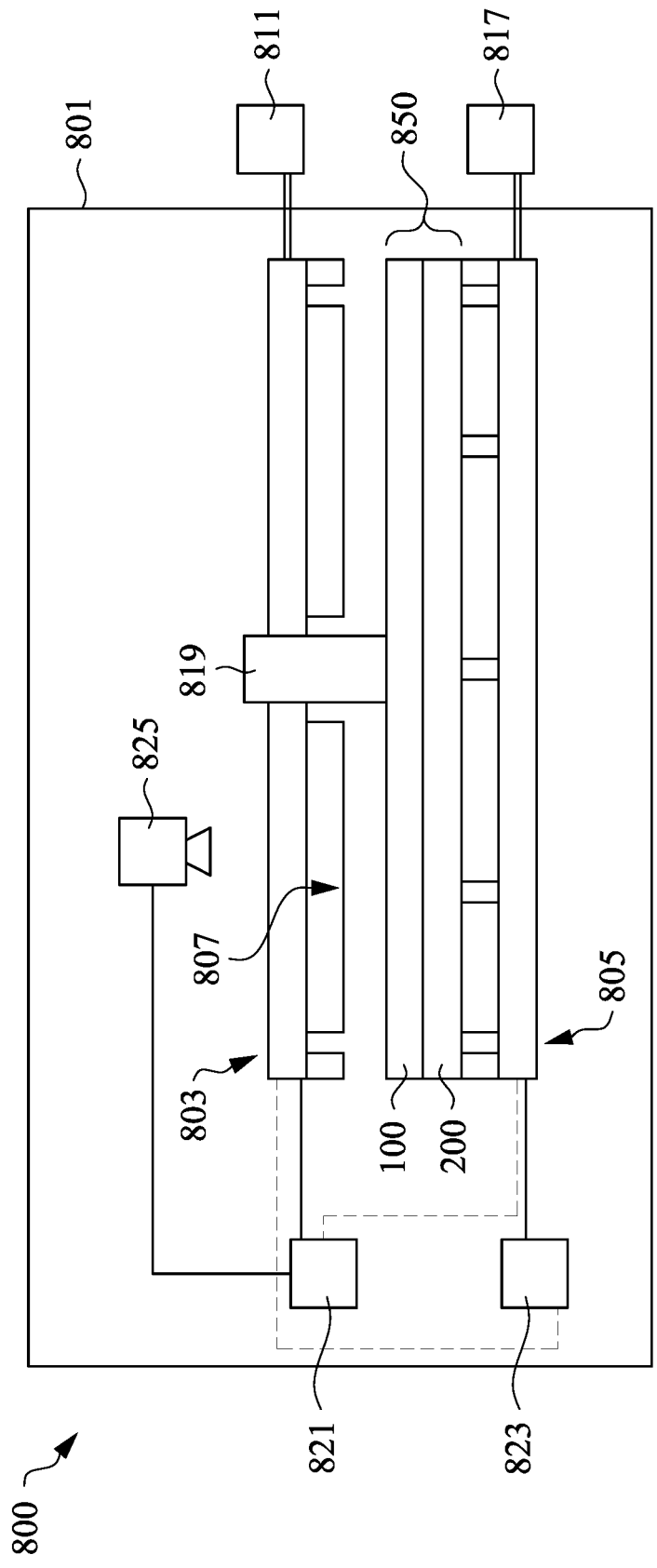

Referring to FIG. 17, as the force is applied to the first wafer 100 and the second wafer 200, the first vacuum pump 811 is turned off and the vacuum is removed from the first wafer 100. The first wafer 100 and the second wafer 200 will bond together at each point where the first wafer 100 comes into contact with the second wafer 200. As the first wafer 100 is pre-warped in the outward direction with respect to the first surface 807, this pressure will cause the bonding to proceed in a wave (also referred to as a bonding wave) from the first point P1 and move outwards towards the edges of the first wafer 100 and the second wafer 200, thereby forming the wafer stack 850. By performing the plasma activation process on the first wafer 100 and/or the second wafer 200 as described above with reference FIGS. 8A-8E, the bonding wave propagates with a speed that is independent of the in-plane direction of the first wafer 100 and the second wafer 200 in some embodiments. Furthermore, the bond strength is also independent of the in-plane direction of the first wafer 100 and the second wafer 200 in some embodiments. In some embodiments, the bonding wave propagation speed may be further tuned by tuning a process pressure in the chamber 801, temperatures of the first wafer 100 and the second wafer 200, and thicknesses of the first wafer 100 and the second wafer 200. In some embodiments, the bonding wave propagation speed is decreased by increasing the process pressure in the chamber 801. In some embodiments, the bonding wave propagation speed is decreased by increasing a temperature of the first wafer 100 or a temperature of the second wafer 200. In some embodiments, the bonding wave propagation speed is decreased by increasing a thickness of the first wafer 100 or a thickness of the second wafer 200.

Figure 18:
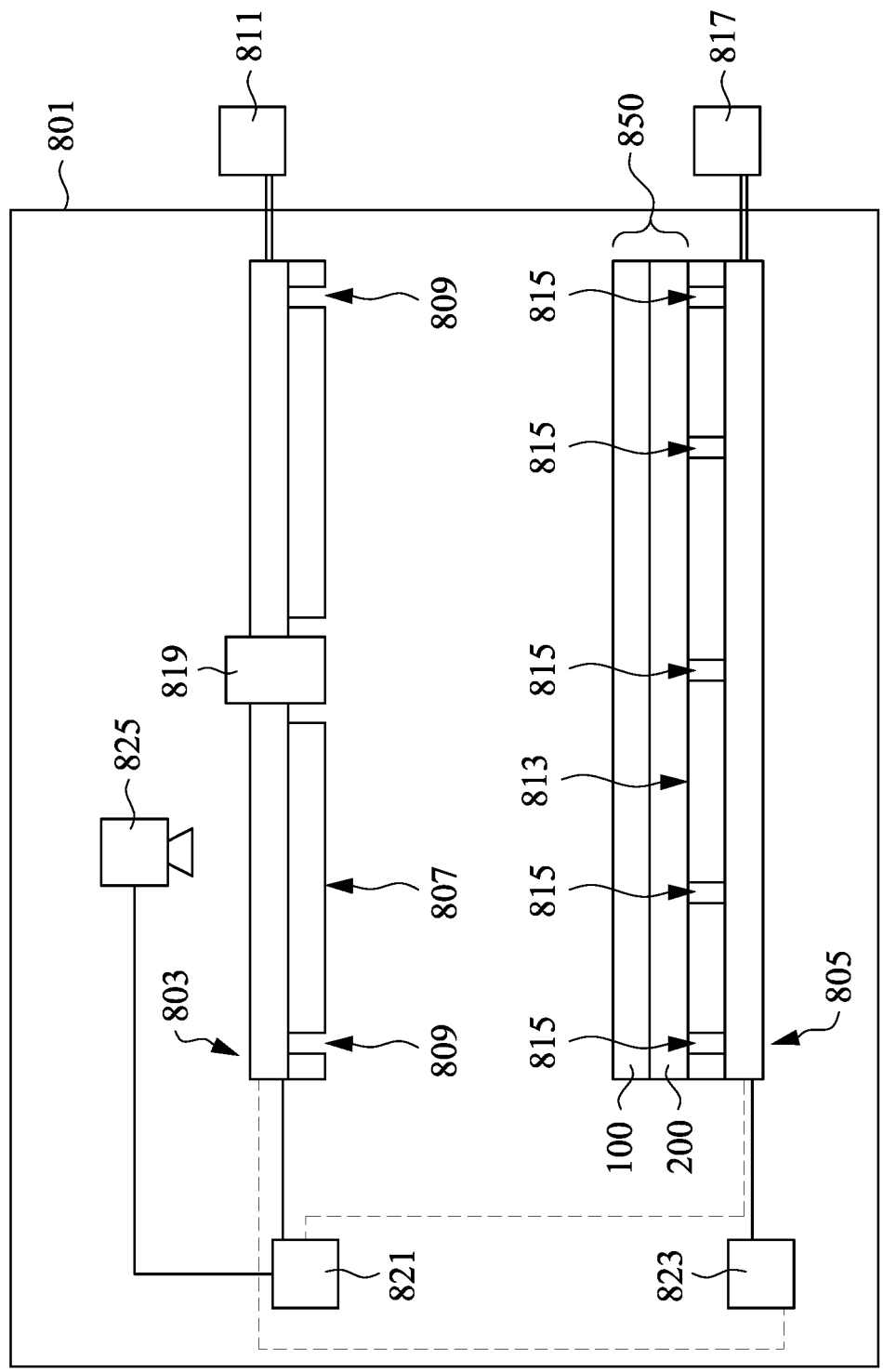

Referring to FIG. 18, in some embodiments, the first chuck 803, in which the vacuum has been removed, is moved by the motor 821 away from the wafer stack 850, leaving the wafer stack 850 on the second chuck 805. Subsequently, the wafer stack 850 is removed from the second chuck 805. In some embodiments, the second vacuum pump 817 may be turned off and an atmospheric pressure may be allowed to enter the second openings 815. Once the pressure in the second openings 815 is equalized with the ambient pressure, the wafer stack 850 may be removed from the second chuck 805.

In some embodiments, an anneal process is performed on the wafer stack 850 to strengthen the bond between the first wafer 100 and the second wafer 200. In some embodiments, the anneal process is performed before removing the wafer stack 850 from the second chuck 805. In such embodiments, the anneal process may be a thermal anneal process performed using the thermal controller 823 to increase a temperature of the wafer stack 850 to a desired temperature. In some embodiments, the anneal process is performed at a temperature between about 100° C. and about 800° C. In other embodiments, the anneal process is performed after removing the wafer stack 850 from the second chuck 805.

After forming the wafer stack 850, the robotic arm 950 transfers the wafer stack 850 to a load port 300 through the transfer chamber 900. Subsequently, the wafer stack 850 is unloaded from the wafer bonding apparatus 1000 to undergo further processing. In some embodiments, after the wafer stack 850 is unloaded from the wafer bonding apparatus 1000, an infrared (IR) measurement (not shown) can be performed to check the alignment of the bonding for overlay control. In some embodiments, the IR energy is directed through the wafer stack 850 and the misalignment of the first alignment marks of the first wafer 100 relative to the second alignment marks of the second wafer 200 may be measured. In some embodiments, an overlay control system described above is a module of the wafer bonding apparatus 1000. In other embodiments, the overlay control system is separate from the wafer bonding apparatus 1000.

Figure 19:
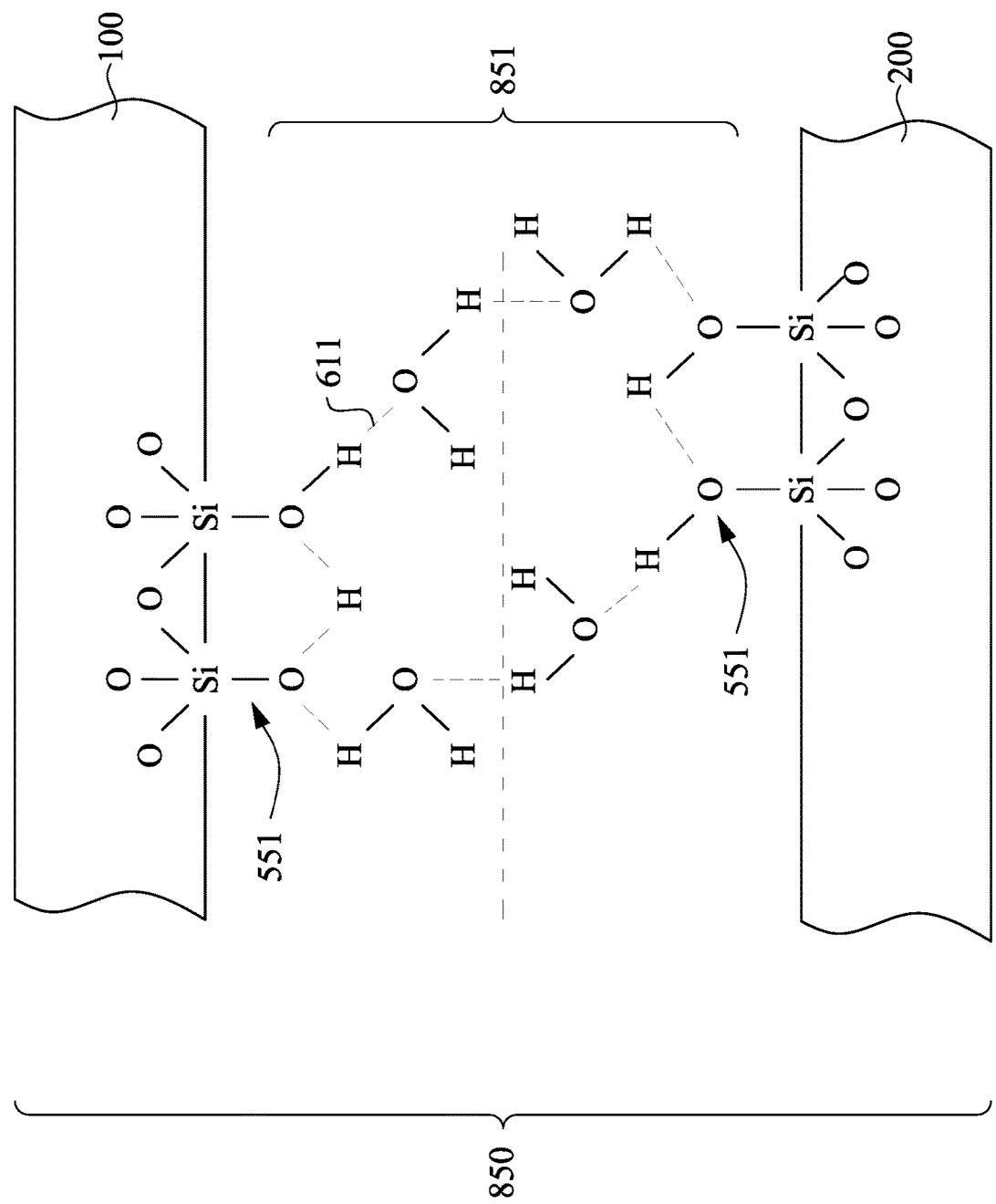

FIG. 19 illustrates a cross-sectional view of the wafer stack 850 after performing the bonding process as described above with reference to FIGS. 15-18 and before performing the anneal process in accordance with some embodiments. In some embodiments, a bonding interface 851 between the first wafer 100 and the second wafer 200 comprises water molecules ($H_2O$) interposed between silanol groups 551 of the first wafer 100 and the silanol groups 551 of the second wafer 200.

Figure 20:
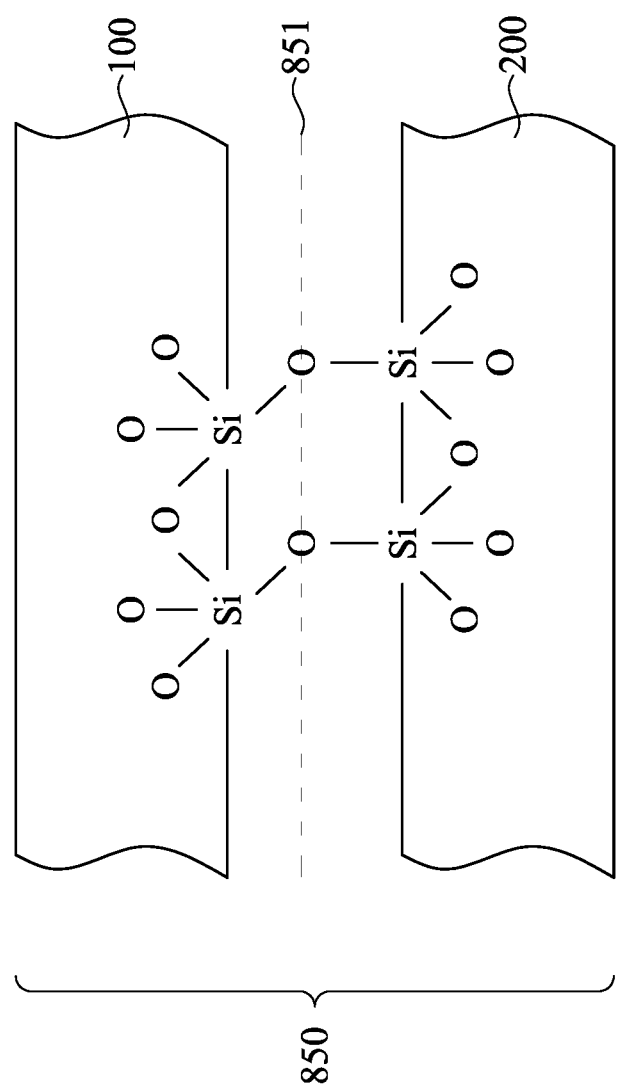

FIG. 20 illustrates a cross-sectional view of the wafer stack 850 after performing the anneal process in accordance with some embodiments. In some embodiments, the anneal process removes the water molecules ($H_2O$) at the bonding interface 851 between the first wafer 100 and the second wafer 200 (see FIG. 19). After removing the water molecules ($H_2O$), oxygen atoms (O) from the silanol groups 551 of one of the wafers (for example, the first wafer 100 or the second wafer 200) form covalent bonds with silicon atoms from another one of the wafers (for example, the second wafer 200 or the first wafer 100).

Various embodiments describe a plasma grid assembly design in a remote plasma system to modulate plasma intensity during a plasma activation process performed on a wafer before a bonding process. The plasma grid assembly (such as for example, the plasma grid assembly 523 illustrated in FIG. 8C) allows for modulating plasma intensity along different in-plain crystal directions of a wafer. In some embodiments, the plasma intensity modulation allows for reducing bonding wave propagation speed difference and bond strength difference between various in-plane crystal directions of the wafer due to anisotropy of mechanical properties of the wafer. Accordingly, distortion caused by anisotropy of the wafer along different in-plane crystal directions are reduced, bubble defects are reduced or avoided, and bond strength uniformity is improved.

In accordance with an embodiment, a method includes performing a first plasma activation process on a first surface of a first wafer. The first plasma activation process forms a first high-activation region and a first low-activation region on the first surface of the first wafer. A first cleaning process is performed on the first surface of the first wafer. The first cleaning process forms a first plurality of silanol groups in the first high-activation region and the first low-activation region. The first high-activation region includes more silanol groups than the first low-activation region. The first wafer is bonded to a second wafer.

Embodiments may include one or more of the following features. The method further including: before bonding the first wafer to the second wafer, performing a second plasma activation process on a second surface of the second wafer, where the second plasma activation process forms a second high-activation region and a second low-activation region on the second surface of the second wafer; and before bonding the first wafer to the second wafer, performing a second cleaning process on the second surface of the second wafer, where the second cleaning process forms a second plurality of silanol groups in the second high-activation region and the second low-activation region, and where the second high-activation region comprises more silanol groups than the second low-activation region. The method where, before performing the first cleaning process on the first wafer, the first high-activation region includes more silicon dangling bonds than the first low-activation region. The method where performing the first cleaning process on the first surface of the first wafer includes rinsing the first surface of the first wafer using de-ionized water. The method where each of the first high-activation region and the first low-activation region has a shape of a circular sector. The method where the first high-activation region overlaps with a <110> crystallographic direction of the first wafer. The method where the first low-activation region overlaps with a <100> crystallographic direction of the first wafer.

In accordance with another embodiment, A method includes performing a first plasma activation process on a first surface of a first wafer, performing a first cleaning process on the first surface of the first wafer, and bonding the first wafer to a second wafer. The first plasma activation process includes placing the first wafer on a first chuck of a plasma module. The plasma module includes a plasma grid assembly over the first wafer. The plasma grid assembly includes a coarse mesh region and a fine mesh region. The plasma grid assembly is rotated such that the coarse mesh region overlaps with a first crystallographic direction of the first wafer and the fine mesh region overlaps with a second crystallographic direction of the first wafer. The first crystallographic direction of the first wafer is different from the second crystallographic direction of the first wafer. The first surface of the first wafer is exposed to a first plasma thought the plasma grid assembly. The first wafer is removed from the plasma module. The first cleaning process includes placing the first wafer on a second chuck of a cleaning module. First de-ionized water is dispensed over the first surface of the first wafer.

Embodiments may include one or more of the following features. The method where each of the coarse mesh region and the fine mesh region has a shape of a circular sector. The method where the coarse mesh region includes first openings, the first openings having a first diameter. The method where the fine mesh region includes second openings, the second openings having a second diameter less than the first diameter. The method further including: performing a second plasma activation process on a second surface of the second wafer, where the second plasma activation process includes: placing the second wafer on the first chuck of the plasma module; rotating the plasma grid assembly such that the coarse mesh region overlaps with a first crystallographic direction of the second wafer and the fine mesh region overlaps with a second crystallographic direction of the second wafer, the first crystallographic direction of the second wafer being different from the second crystallographic direction of the second wafer; exposing the second surface of the second wafer to a second plasma thought the plasma grid assembly; and removing the second wafer from the plasma module; and performing a second cleaning process on the second surface of the second wafer, where the second cleaning process includes: placing the second wafer on the second chuck of the cleaning module; and dispensing second de-ionized water over the second surface of the second wafer. The method where the first crystallographic direction of the first wafer is a <110> crystallographic direction. The method where the second crystallographic direction of the first wafer is a <100> crystallographic direction.

In accordance with yet another embodiment, an apparatus includes a plasma module. The plasma module includes: a chamber comprising a plasma generation region and a process region, a chuck in the process region, and a plasma grid assembly over the chuck and interposed between the plasma generation region and the process region. The plasma module is configured to generate a plasma in the plasma generation region. The chuck is configured to hold a wafer. The plasma grid assembly is configured to modulate a flux of the plasma passing through the plasma grid assembly. The plasma grid assembly includes a coarse mesh region and a fine mesh region.

Embodiments may include one or more of the following features. The apparatus where each of the coarse mesh region and the fine mesh region has a shape of a circular sector. The apparatus where the coarse mesh region includes first openings, the first openings having a first diameter. The apparatus where the fine mesh region includes second openings, the second openings having a second diameter less than the first diameter. The apparatus where the coarse mesh region provides a greater plasma flux than the fine mesh region. The apparatus where the plasma grid assembly is configured to rotate by a desired angle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    performing a first plasma activation process on a first surface of a first wafer, wherein the first plasma activation process forms a first high-activation region and a first low-activation region on the first surface of the first wafer, wherein the first high-activation region is formed through a coarse mesh region of a plasma grid assembly, wherein the first low-activation region is formed through a fine mesh region of the plasma grid assembly, wherein the coarse mesh region has fewer openings than the fine mesh region;
    performing a first cleaning process on the first surface of the first wafer, wherein the first cleaning process forms a first plurality of silanol groups in the first high-activation region and the first low-activation region, and wherein the first high-activation region comprises more silanol groups than the first low-activation region; and
    bonding the first wafer to a second wafer.

2. The method of claim 1, further comprising:
    before bonding the first wafer to the second wafer, performing a second plasma activation process on a second surface of the second wafer, wherein the second plasma activation process forms a second high-activation region and a second low-activation region on the second surface of the second wafer; and
    before bonding the first wafer to the second wafer, performing a second cleaning process on the second surface of the second wafer, wherein the second cleaning process forms a second plurality of silanol groups in the second high-activation region and the second low-activation region, and wherein the second high-activation region comprises more silanol groups than the second low-activation region.

3. The method of claim 1, wherein, before performing the first cleaning process on the first wafer, the first high-activation region comprises more silicon dangling bonds than the first low-activation region.

4. The method of claim 1, wherein performing the first cleaning process on the first surface of the first wafer comprises rinsing the first surface of the first wafer using de-ionized water.

5. The method of claim 1, wherein each of the first high-activation region and the first low-activation region has a shape of a circular sector.

6. The method of claim 1, wherein the first high-activation region overlaps with a <110> crystallographic direction of the first wafer.

7. The method of claim 1, wherein the first low-activation region overlaps with a <100> crystallographic direction of the first wafer.

8. A method comprising:
    performing a first plasma activation process on a first surface of a first wafer, wherein the first plasma activation process comprises:
        placing the first wafer on a first chuck of a plasma module, the plasma module comprising a plasma grid assembly over the first wafer, the plasma grid assembly comprising a coarse mesh region and a fine mesh region, wherein the coarse mesh region extends from a center of the plasma grid assembly to a first point on an outer edge of the plasma grid assembly, the coarse mesh region being a single continuous region, wherein the fine mesh region extends from the center of the plasma grid assembly to a second point on the outer edge of the plasma grid assembly, the fine mesh region being a single continuous region, wherein the coarse mesh region has a first uniform pattern of first openings, wherein the fine mesh region has a second uniform pattern of second openings;
        rotating the plasma grid assembly such that the coarse mesh region overlaps with a first crystallographic direction of the first wafer and the fine mesh region overlaps with a second crystallographic direction of the first wafer, the first crystallographic direction of the first wafer being different from the second crystallographic direction of the first wafer;
        exposing the first surface of the first wafer to a first plasma through the plasma grid assembly, wherein exposing the first surface to the first plasma through the coarse mesh region forms a high-activation region, wherein exposing the first surface to the first plasma through the fine mesh region forms a low-activation region; and
        removing the first wafer from the plasma module;
    performing a first cleaning process on the first surface of the first wafer, wherein the first cleaning process comprises:

placing the first wafer on a second chuck of a cleaning module; and dispensing first de-ionized water over the first surface of the first wafer; and bonding the first wafer to a second wafer.

9. The method of claim 8, wherein each of the coarse mesh region and the fine mesh region has a shape of a circular sector.

10. The method of claim 8, wherein the second openings have a second diameter less than a first diameter of the first openings.

11. The method of claim 8, further comprising:
performing a second plasma activation process on a second surface of the second wafer, wherein the second plasma activation process comprises:
placing the second wafer on the first chuck of the plasma module;
rotating the plasma grid assembly such that the coarse mesh region overlaps with a first crystallographic direction of the second wafer and the fine mesh region overlaps with a second crystallographic direction of the second wafer, the first crystallographic direction of the second wafer being different from the second crystallographic direction of the second wafer;
exposing the second surface of the second wafer to a second plasma thought the plasma grid assembly; and
removing the second wafer from the plasma module; and
performing a second cleaning process on the second surface of the second wafer, wherein the second cleaning process comprises:
placing the second wafer on the second chuck of the cleaning module; and
dispensing second de-ionized water over the second surface of the second wafer.

12. The method of claim 8, wherein the first crystallographic direction of the first wafer is a <110> crystallographic direction.

13. The method of claim 8, wherein the second crystallographic direction of the first wafer is a <100> crystallographic direction.

14. A method comprising:
performing a first plasma activation process on a first surface of a first wafer through a plasma grid assembly, wherein the first wafer has a first region having a first crystallographic direction and a second region having a second crystallographic direction, wherein the first plasma activation process forms a first high-activation region in the first region through a coarse mesh region of the plasma grid assembly and forms a first low-activation region in the second region through a fine mesh region of the plasma grid assembly, wherein the coarse mesh region has fewer and larger openings than the fine mesh region;
performing a first cleaning process on the first surface of the first wafer; and
bonding the first wafer to a second wafer.

15. The method of claim 14, further comprising, prior to bonding:
performing a second plasma activation process on a second surface of the second wafer, wherein the second plasma activation process forms a second high-activation region and a second low-activation region on the second surface of the second wafer; and
performing a second cleaning process on the second surface of the second wafer.

16. The method of claim 14, wherein the first cleaning process forms silanol groups in the first high-activation region and the first low-activation region, and wherein the first high-activation region comprises more silanol groups than the first low-activation region.

17. The method of claim 14, wherein performing the first cleaning process on the first surface of the first wafer comprises rinsing the first surface of the first wafer with de-ionized water.

18. The method of claim 14, wherein the first high-activation region overlaps with a <110> crystallographic direction of the first wafer, wherein the first low-activation region overlaps with a <100> crystallographic direction of the first wafer.

19. The method of claim 14, wherein the coarse mesh region has a uniform pattern of openings extending from a center of the plasma grid assembly to an outer edge of the plasma grid assembly.

20. The method of claim 1, wherein the coarse mesh region has larger holes than the fine mesh region.

* * * * *